(12) United States Patent
Sorschag et al.

(10) Patent No.: US 9,837,280 B2
(45) Date of Patent: Dec. 5, 2017

(54) METHODS FOR MANUFACTURING SEMICONDUCTOR DEVICES

(71) Applicant: Infineon Technologies Dresden GmbH, Dresden (DE)

(72) Inventors: Kurt Sorschag, Villach-Landskron (AT); Daniel Sarlette, Radebeul (DE); Felix Braun, Dresden (DE); Marcel Heller, Helmsdorf (DE); Dieter Kaiser, Dresden (DE); Ingo Meusel, Dresden (DE); Marko Lemke, Dresden (DE); Anton Mauder, Kolbermoor (DE); Helmut Strack, Munich (DE)

(73) Assignee: Infineon Technologies Dresden GmbH, Dresden (DE)

( * ) Notice: Subject to any disclaimer, the term of this patent is extended or adjusted under 35 U.S.C. 154(b) by 30 days.

(21) Appl. No.: 15/229,632

(22) Filed: Aug. 5, 2016

(65) Prior Publication Data

US 2016/0343577 A1 Nov. 24, 2016

Related U.S. Application Data

(60) Division of application No. 14/063,362, filed on Oct. 25, 2013, now Pat. No. 9,437,440, which is a
(Continued)

(51) Int. Cl.
*H01L 21/20* (2006.01)
*H01L 21/36* (2006.01)
(Continued)

(52) U.S. Cl.
CPC .. *H01L 21/30604* (2013.01); *H01L 21/02532* (2013.01); *H01L 21/02658* (2013.01);
(Continued)

(58) Field of Classification Search
CPC ....... H01L 29/06; H01L 21/762; H01L 21/02; H01L 29/66; H01L 29/2003; H01L 29/872; H01L 29/78; H01L 21/336
(Continued)

(56) References Cited

U.S. PATENT DOCUMENTS 6,323,090 B1 11/2001 Zommer
6,528,398 B1 3/2003 Ghandehari et al.
(Continued)

FOREIGN PATENT DOCUMENTS

CN 1997588 A 7/2007
CN 101681017 A 3/2010
(Continued)

*Primary Examiner* — Sheikh Maruf
(74) *Attorney, Agent, or Firm* — Murphy, Bilak & Homiller, PLLC

(57) ABSTRACT

A method for forming a semiconductor device includes providing a semiconductor substrate having an upper side and comprising, in a vertical cross-section substantially orthogonal to the upper side, a plurality of semiconductor mesas of a first monocrystalline semiconductor material which are spaced apart from each other by sacrificial layers selectively etchable with respect to the first monocrystalline semiconductor material and arranged in trenches extending from the upper side into the semiconductor substrate, forming on the semiconductor mesas a support structure mechanically connecting the semiconductor mesas, at least partly replacing the sacrificial layers while the semiconductor mesas remain mechanically connected via the support structure, and at least partly removing the support structure.

6 Claims, 27 Drawing Sheets

Related U.S. Application Data continuation-in-part of application No. 13/682,995, filed on Nov. 21, 2012, now Pat. No. 9,054,123.

(51) Int. Cl.
| | |
|---|---|
| *H01L 21/00* | (2006.01) |
| *H01L 21/26* | (2006.01) |
| *H01L 21/306* | (2006.01) |
| *H01L 21/02* | (2006.01) |
| *H01L 21/311* | (2006.01) |
| *H01L 29/66* | (2006.01) |
| *H01L 29/06* | (2006.01) |
| *H01L 29/78* | (2006.01) |

(52) U.S. Cl.
CPC ......... *H01L 21/306* (2013.01); *H01L 21/311* (2013.01); *H01L 29/0657* (2013.01); *H01L 29/66348* (2013.01); *H01L 29/66734* (2013.01); *H01L 29/66795* (2013.01); *H01L 29/7827* (2013.01)

(58) Field of Classification Search
USPC ....... 438/285, 259, 270, 429, 580, 504, 700; 257/494, 471, 336, 331, E21.214, 257/E21.305
See application file for complete search history.

(56) References Cited

U.S. PATENT DOCUMENTS

| | | | |
|---|---|---|---|
| 2004/0144985 A1 | 7/2004 | Zhang et al. | |
| 2005/0023571 A1 | 2/2005 | Disney | |
| 2006/0189053 A1* | 8/2006 | Wang | H01L 29/165 438/197 |
| 2006/0209887 A1 | 9/2006 | Bhalla et al. | |
| 2007/0026629 A1* | 2/2007 | Chen | H01L 21/82341 438/424 |
| 2007/0170542 A1* | 7/2007 | Derderian | H01L 21/76224 257/510 |
| 2007/0264809 A1 | 11/2007 | Richieri | |
| 2008/0073707 A1 | 3/2008 | Darwish | |
| 2008/0076222 A1 | 3/2008 | Zundel et al. | |
| 2008/0083966 A1 | 4/2008 | Oonishi | |
| 2008/0087896 A1 | 4/2008 | Chiola | |
| 2008/0173875 A1 | 7/2008 | Koshka et al. | |
| 2010/0013552 A1 | 1/2010 | Darwish et al. | |
| 2010/0025805 A1* | 2/2010 | Hall | H01L 21/76232 257/506 |
| 2010/0207205 A1 | 8/2010 | Grebs et al. | |
| 2010/0314707 A1 | 12/2010 | Yedinak et al. | |
| 2010/0327288 A1 | 12/2010 | Chao et al. | |
| 2011/0049532 A1* | 3/2011 | Odekirk | H01L 29/1066 257/77 |
| 2011/0186841 A1 | 8/2011 | Meunier-Bellard et al. | |
| 2011/0220990 A1 | 9/2011 | Chang et al. | |
| 2011/0284953 A1 | 11/2011 | Long et al. | |
| 2012/0037983 A1 | 2/2012 | Hshieh | |
| 2012/0049270 A1* | 3/2012 | Hirler | H01L 29/6634 257/328 |
| 2012/0080748 A1 | 4/2012 | Hsieh | |
| 2012/0146133 A1 | 6/2012 | Hirler et al. | |
| 2012/0181575 A1* | 7/2012 | Pfirsch | H01L 29/0834 257/139 |
| 2012/0205772 A1* | 8/2012 | Chen | H01L 29/0623 257/471 |
| 2012/0217512 A1 | 8/2012 | Renaud et al. | |
| 2012/0292732 A1 | 11/2012 | Grivna et al. | |
| 2013/0105885 A1* | 5/2013 | Flachowsky | H01L 29/78 257/330 |
| 2013/0181319 A1 | 7/2013 | Huang et al. | |
| 2013/0221429 A1 | 8/2013 | Yang | |
| 2013/0228891 A1 | 9/2013 | Kao et al. | |
| 2013/0264390 A1 | 10/2013 | Frey et al. | |
| 2014/0070309 A1 | 3/2014 | Sakai et al. | |
| 2015/0179791 A1* | 6/2015 | Kudou | H01L 29/7813 257/77 |

FOREIGN PATENT DOCUMENTS

| | | |
|---|---|---|
| CN | 101852914 A | 10/2010 |
| EP | 0339962 A2 | 11/1989 |
| TW | 200721516 A | 6/2007 |
| WO | 2009034658 A1 | 3/2009 |

\* cited by examiner

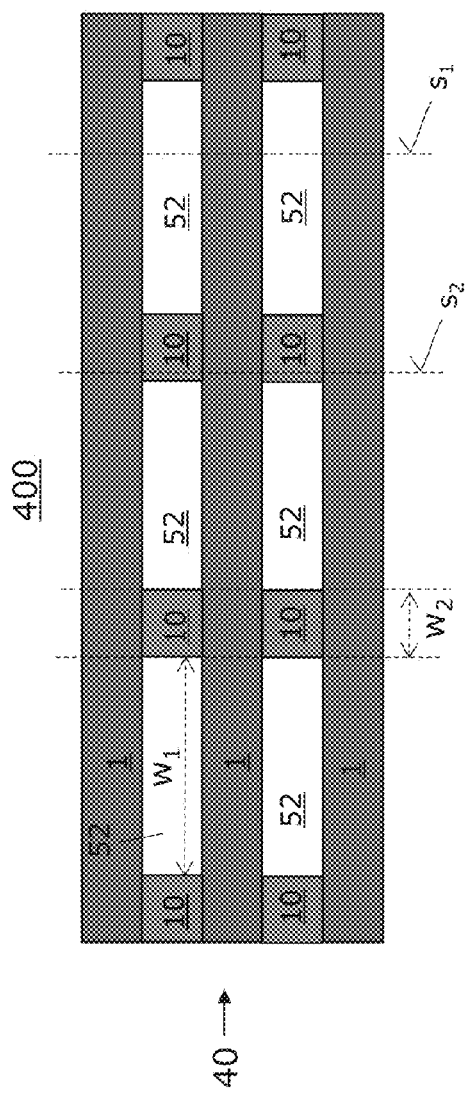
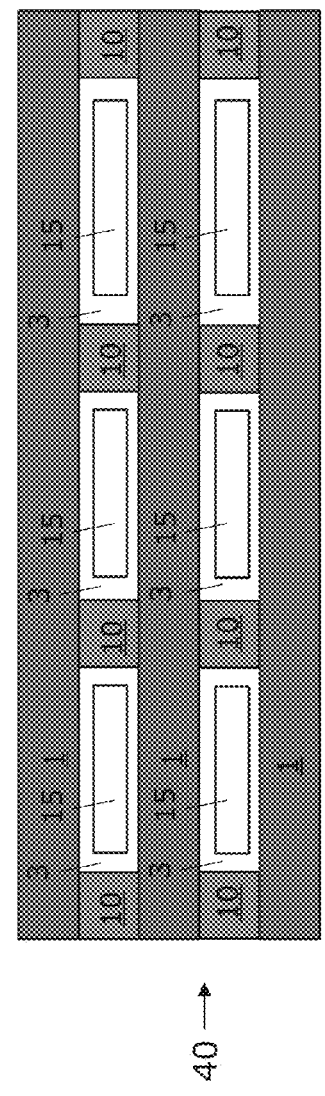
FIG 23A
FIG 23B

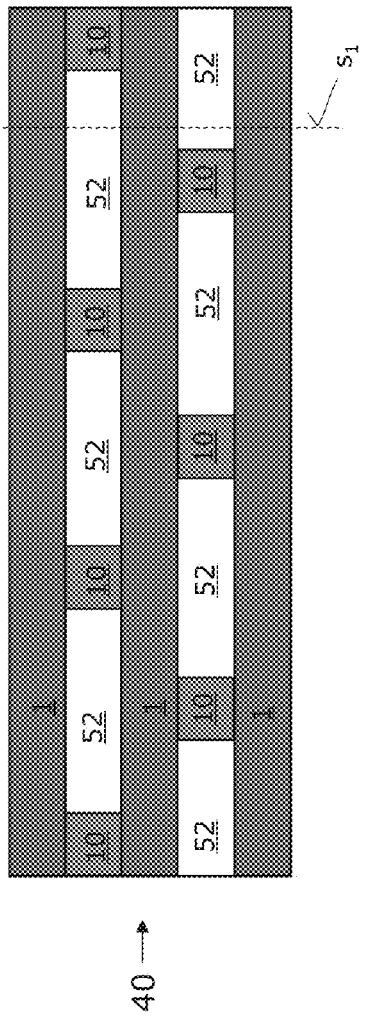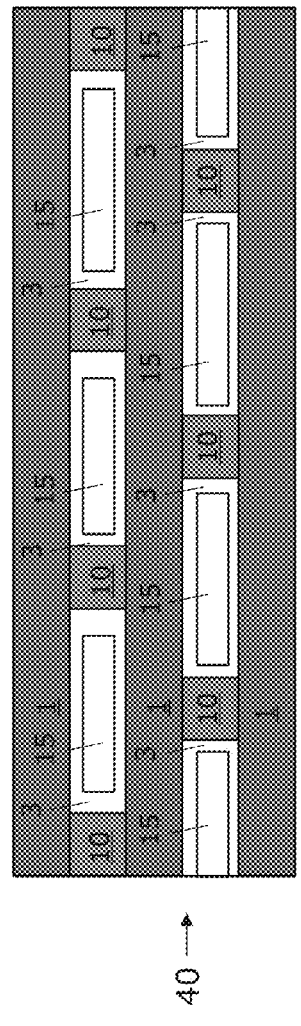

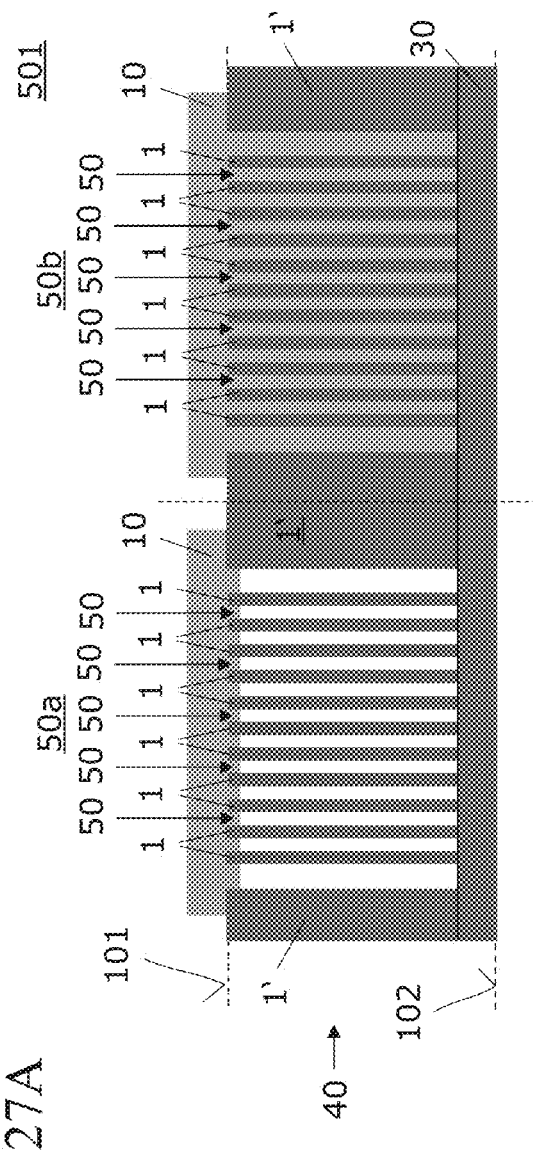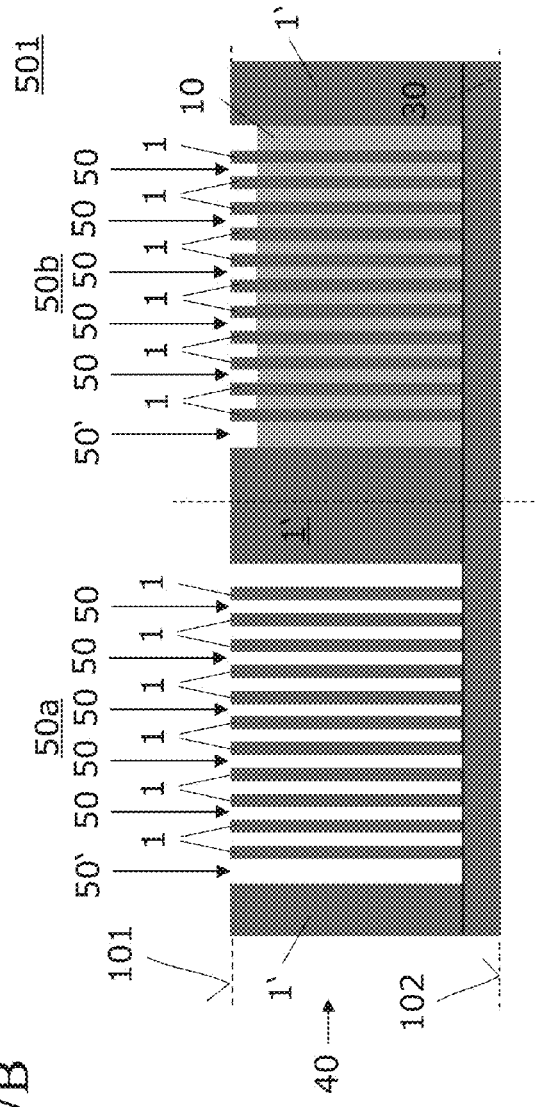

METHODS FOR MANUFACTURING SEMICONDUCTOR DEVICES

PRIORITY CLAIM

This application is a Divisional of U.S. patent application Ser. No. 14/063,362 filed on 25 Oct. 2013, which in turn is a Continuation-In-Part (CIP) of U.S. patent application Ser. No. 13/682,995 filed on 21 Nov. 2012 (now U.S. Pat. No. 9,054,123), the content of both of said applications incorporated herein by reference in their entirety.

TECHNICAL FIELD

Embodiments of the present invention relate to methods for manufacturing semiconductor devices, in particular to a method for manufacturing field-effect semiconductor devices having a plurality of semiconductor mesas.

BACKGROUND

Semiconductor transistors, in particular field-effect controlled switching devices such as a Junction Field Effect Transistor (JFET), a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems. Due to structural efficiency and low on-resistance $R_{on}$, vertical trench MOSFETs are widely used, in particular in power applications.

Several semiconductor concepts use a sequence of thin trenches and semiconductor mesas or semiconductor lamellas. For example, one configuration of a vertical trench MOSFET is the so-called TEDFET (Trench Extended Drain Field-Effect Transistor) which allows for an improved decoupling of voltage blocking capability and on-resistance $R_{on}$ compared to conventional MOSFETs by additionally controlling the conductivity in the drift region by a drift control region which is separated from the drift region by an accumulation dielectric formed in trenches vertically extending along the drift region. Another example is Multiple Gate Field-Effect Transistors (MuGFETs) such as FinFETs which are double-gate transistors that may be built on SOI substrates (silicon-on-insulator) and are characterized by conducting channels which are wrapped by a thin silicon "fin" forming the body region of the field-effect transistor.

Forming the deeply into the semiconductor material extending high quality accumulation dielectrics may, for example for power TEDFETs of higher blocking capability, become complex, in particular for semiconductor mesas and intervening trenches of higher aspect ratios and small pitch. Due the reduced mechanical stability of semiconductor mesas with high aspect ratio, the risk of deflecting the semiconductor mesas, for example during implantation, lithography or wet-chemical etching processes of rinsing and drying or due to a vibration, increases. Deflecting may result in adherence of neighboring semiconductor mesas, for example due to capillary forces. Furthermore, a thin mesa may even break off. These risks may be reduced by replacing water as solvent, for example by using isopropanol. However, this approach is not satisfactory for deep vertical trenches and deeply into the semiconductor material extending thin dielectrics, respectively. Using thicker mesas requires larger areas and thus increases costs.

Accordingly, there is a need to improve manufacturing methods for semiconductor devices having a plurality of semiconductor mesa.

SUMMARY

According to an embodiment of a method for forming a semiconductor device, the method includes: providing a wafer comprising an upper surface and a plurality of semiconductor mesas extending to the upper surface, adjacent pairs of the semiconductor mesas of the plurality of semiconductor mesas being separated from each other by at least one of a trench extending from the upper surface into the wafer, and a non-semiconductor region arranged on a sidewall of the trench; forming a first support structure made of a first material and adjoining the plurality of semiconductor mesas at the upper surface so that the adjacent pairs of the semiconductor mesas are bridged by the first support structure; forming a second support structure made of a second material and adjoining the plurality of semiconductor mesas at the upper surface so that the adjacent pairs of the semiconductor mesas are bridged by the second support structure; removing the first support structure; and at least partly removing the second support structure. The second material is different from the first material.

According to an embodiment of a method for forming a TEDFET, the method includes: providing a wafer having an upper surface and a semiconductor layer extending to the upper surface. Etching wide trenches from the upper surface into the semiconductor layer to form first semiconductor mesas having sidewalls; forming sacrificial oxide layers on the sidewalls of the first semiconductor mesas; performing a selective epitaxial growth process to form second semiconductor mesas in the wide trenches between adjacent sacrificial oxide layers; forming on the upper surface a first support structure of an oxidizable material so that adjacent pairs of the first and second semiconductor mesas are bridged by the first support structure; removing the sacrificial oxide layers to expose sidewalls of the first and second semiconductor mesas; forming on the upper surface a second support structure of a non-oxidizable material so that adjacent pairs of the first and second semiconductor mesas are bridged by the second support structure; thermal oxidizing at least the sidewalls of the first and second semiconductor mesas; and at least partly removing the second support structure.

According to an embodiment of a method for forming a semiconductor device, the method includes: providing a wafer having an upper surface and a plurality of semiconductor mesas which extend to the upper surface and are, next to the upper surface and in a cross-section which is substantially orthogonal to the upper surface, spaced apart from each other; forming a first support structure of a first material and adjoining the plurality of semiconductor mesas at the upper surface so that adjacent pairs of the semiconductor mesas are bridged by the first support structure and that the first support structure is substantially arranged only above the upper surface; forming a second support structure of a second material and adjoining the plurality of semiconductor mesas at the upper surface so that the adjacent pairs of the semiconductor mesas are bridged by the second support structure and that the second support structure is substantially arranged only above the upper surface; processing a side wall of at least one of the plurality of semiconductor mesas; removing the first support structure; and at least partly removing the second support structure. The second material is different from the first material.

According to an embodiment of a method for forming a semiconductor device, the method includes: forming in a semiconductor substrate a plurality of semiconductor mesas extending to an upper side so that adjacent semiconductor mesas are spaced apart from each other by one of a substantially empty trench and a trench substantially filled with a sacrificial layer selectively etchable with respect to the semiconductor mesas; forming a support structure mechanically connecting the semiconductor mesas; and processing the semiconductor substrate from the upper side while the semiconductor mesas are mechanically connected via the support structure.

According to an embodiment of a method for forming a semiconductor device, the method includes: providing a semiconductor substrate having an upper side and comprising, in a vertical cross-section substantially orthogonal to the upper side, a plurality of semiconductor mesas of a first monocrystalline semiconductor material which are spaced apart from each other by sacrificial layers selectively etchable with respect to the first monocrystalline semiconductor material and arranged in trenches extending from the upper side into the semiconductor substrate; forming on the semiconductor mesas a support structure mechanically connecting the semiconductor mesas; at least partly replacing the sacrificial layers while the semiconductor mesas remain mechanically connected via the support structure; and at least partly removing the support structure.

According to an embodiment of a method for forming a semiconductor device, the method includes: providing a semiconductor substrate including an upper side and a semiconductor layer of a semiconductor material and extending to the upper side; etching wide trenches from the upper side into the semiconductor layer so that first semiconductor mesas are formed which are separated from each other by the wide trenches and connected by semiconductor portions of the semiconductor material; forming dielectric layers at least at sidewalls of the first semiconductor mesas; and performing a selective epitaxial growth process to fill at least one of the wide trenches with a second semiconductor mesa.

According to an embodiment of a method for forming a semiconductor device, the method includes: providing a semiconductor substrate having an upper side and including a semiconductor layer extending to the upper side; etching trenches from the upper side into the semiconductor layer so that semiconductor mesas having sidewalls are formed which are separated from each other by the trenches, each of the trenches comprising a bottom wall; forming at the upper side a support structure mechanically connecting the semiconductor mesas; and implanting dopants from the upper side into the bottom walls and/or the sidewalls while the semiconductor mesas are mechanically connected via the support structure.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 23A and 23B illustrate plan views on a semiconductor body during method steps of a method according to further embodiments;

FIGS. 25A and 25B illustrate plan views on a semiconductor body during method steps of a method according to further embodiments;

FIGS. 27A and 27B illustrate vertical cross-sections through a semiconductor body during method steps of a method according to further embodiments.

DETAILED DESCRIPTION

Figure 1:
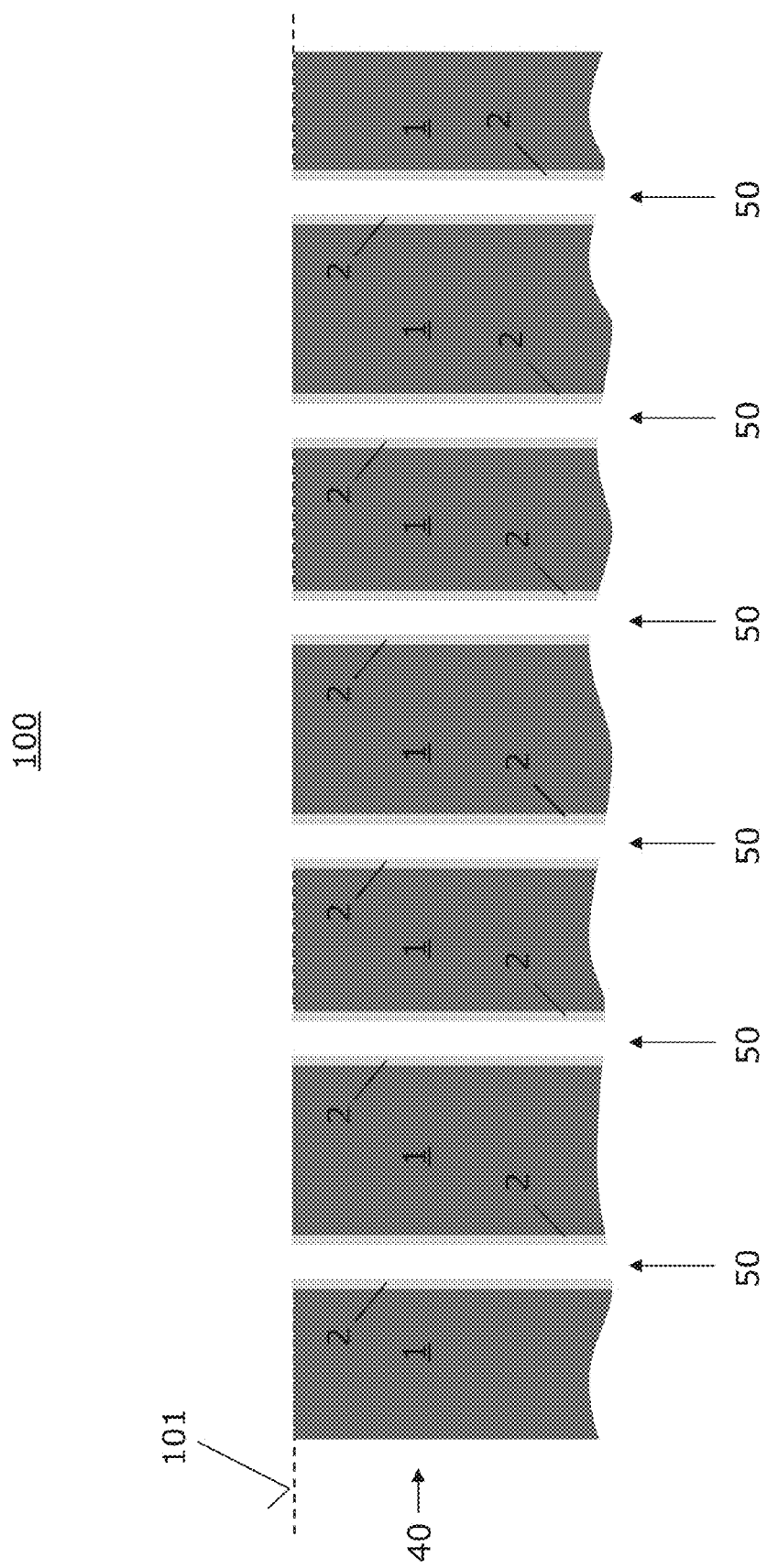
FIGS. 1 to 9 illustrate vertical cross-sections through a semiconductor body during method steps of a method according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface or upper side of a semiconductor substrate or body. This can be for instance the surface of a wafer or a die. In the following, the main surface is also referred to as upper surface.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "n-" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to manufacturing methods for semiconductor devices, in particular to manufacturing methods for field effect semiconductor transistors. Within this specification the terms "semiconductor device" and "semiconductor component" are used synonymously. The semiconductor device typically includes a field-effect structure and an integrated free-wheeling diode. The field-effect structure may be a TEDFET-structure, a MOSFET or an IGBT-structure (Insulated Gate Bipolar Transistor-structure) having a pn-junction forming a body diode between a drift region of the first conductivity type and a body region of the second conductivity type. The semiconductor device is typically a vertical semiconductor device having two load metallizations, for example a source metallization and a drain metallization, which are arranged opposite to each other and in low resistive contact with a respective contact region.

Typically, the semiconductor device is a power semiconductor device having an active area with a plurality of IGBT-cells, MOSFET-cells or TEDFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range.

Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode which is situated next to, and insulated from the body region by an insulating region forming a gate dielectric region and configured to form and/or control a channel region next to a heterojunction or through the body region as well as an electrode in low resistive electric contact with a gate region adjoining a channel region of an opposite doping type and configured to shape a depleted portion in the channel region by charging to an appropriate voltage.

The insulating region may be made of any suitable dielectric material such as silicon oxide, for example thermal silicon oxide, silicon nitride, siliconoxynitride or the like.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, $PtSi$, $CoSi_2$, $WSi_2$ or the like. The metallization may also include different electrically conductive materials, for example a stack of those materials.

In the context of the present specification, the terms "semiconductor mesa" or "mesa region" intends to describe semiconductor regions or semiconductor portions of the semiconductor body which extend from a common substrate, for example a semiconductor substrate, to a main surface of the semiconductor body or wafer and are in respective upper portions spaced apart from each other. Typically, a mesa region is, in a vertical cross-section which is substantially orthogonal to the main surface, arranged between two adjacent vertical trenches extending from the main surface into the semiconductor body or wafer. In the context of the present specification, the term "empty trench" intends to describe a trench that is at least in a vertical cross-section not filled with a solid material and shall embrace trenches filled with a gas such as air.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

Referring to FIGS. 1 to 10 method steps of a method for forming a semiconductor device 100 are explained. FIGS. 1 to 9 illustrate vertical cross-sections through semiconductor device 100 and a semiconductor body 40 of semiconductor device 100, respectively. Note that the semiconductor device 100 to be manufactured is typically a power semiconductor device with a plurality unit cells arranged in an active area for switching and/or controlling a vertical current. Furthermore, semiconductor device 100 is typically manufactured on wafer-level. For sake of clarity, the FIGS. 1 to 9 typically only represent a section through the wafer 40.

According to an embodiment, wafer 40 has an upper surface 101 and a plurality of semiconductor mesas 1 extending to the upper surface 101. Adjacent pairs of the semiconductor mesas 1 are separated from each by respective trenches 50 which extend from the upper surface 101 into wafer 40, and by non-semiconductor regions 2 arranged on the sidewalls of the trenches 50 and semiconductor mesas 1, respectively. The wafer 40 may for example be a silicon wafer or a silicon-on-insulator wafer (SOI-wafer). Note that FIG. 1 only illustrates an upper portion of wafer 40. The non-semiconductor regions 2 may, for example, be made of silicon oxide or carbon.

In the exemplary embodiment, the semiconductor mesas 1 and trenches 50 are substantially bar-shaped when seen from above.

Figure 2:
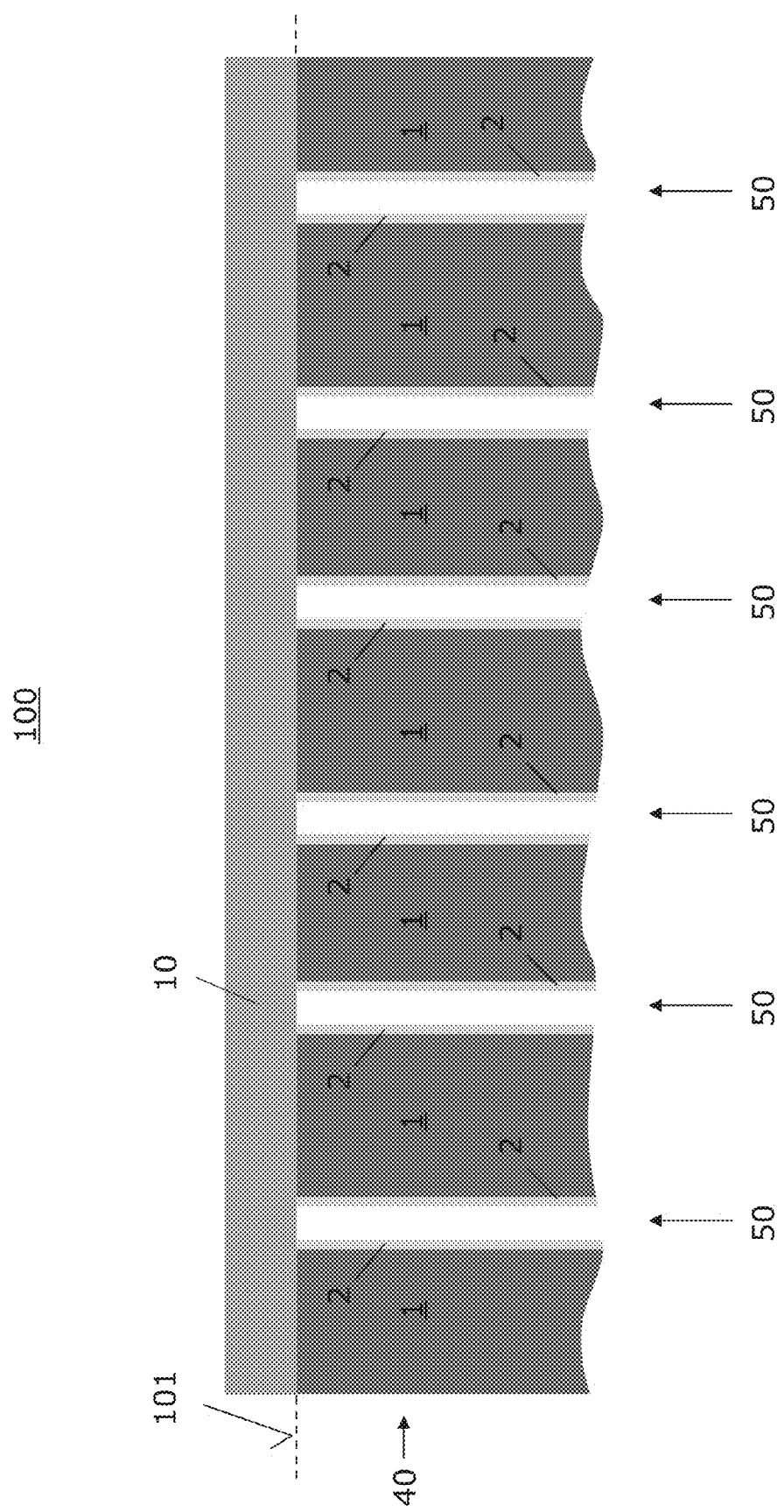

After providing wafer 40, a first support structure 10 of a first material is typically formed at the upper surface 101 so that the adjacent pairs of the semiconductor mesas 1 are bridged by the first support structure 10. As illustrated in FIG. 2, forming the first support structure 10 typically includes forming a first layer 10 of the first material which adjoins each semiconductor mesas 1 and is substantially arranged only above the plurality of semiconductor mesas 1. Accordingly, the trenches 50 remain substantially free of the first material. This facilitates further processing.

In the exemplary embodiment, first material is made of an oxidizable material such as carbon, or diamond-like carbon that may be formed in a CVD-process (Chemical Vapour Deposition). For example, the first layer 10 may be formed as amorphous carbon using a PECVD-process (Plasma-Enhanced Chemical Vapour Deposition) in a hydrocarbon rich atmosphere.

Figure 3:
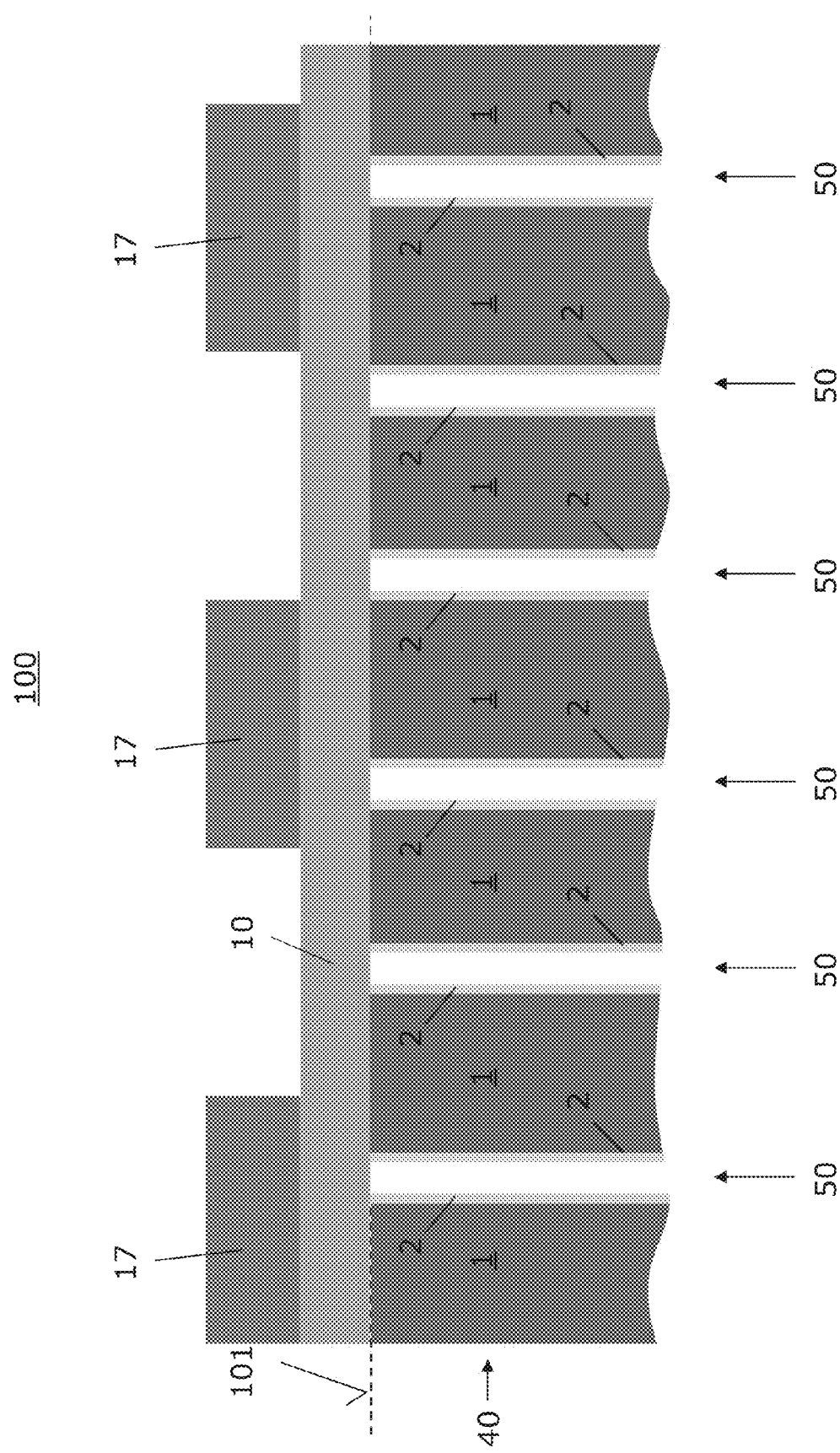

Thereafter, a mask 17 is formed on the first layer 10 as illustrated in FIG. 3. This typically includes a photolithographic process.

Figure 4:
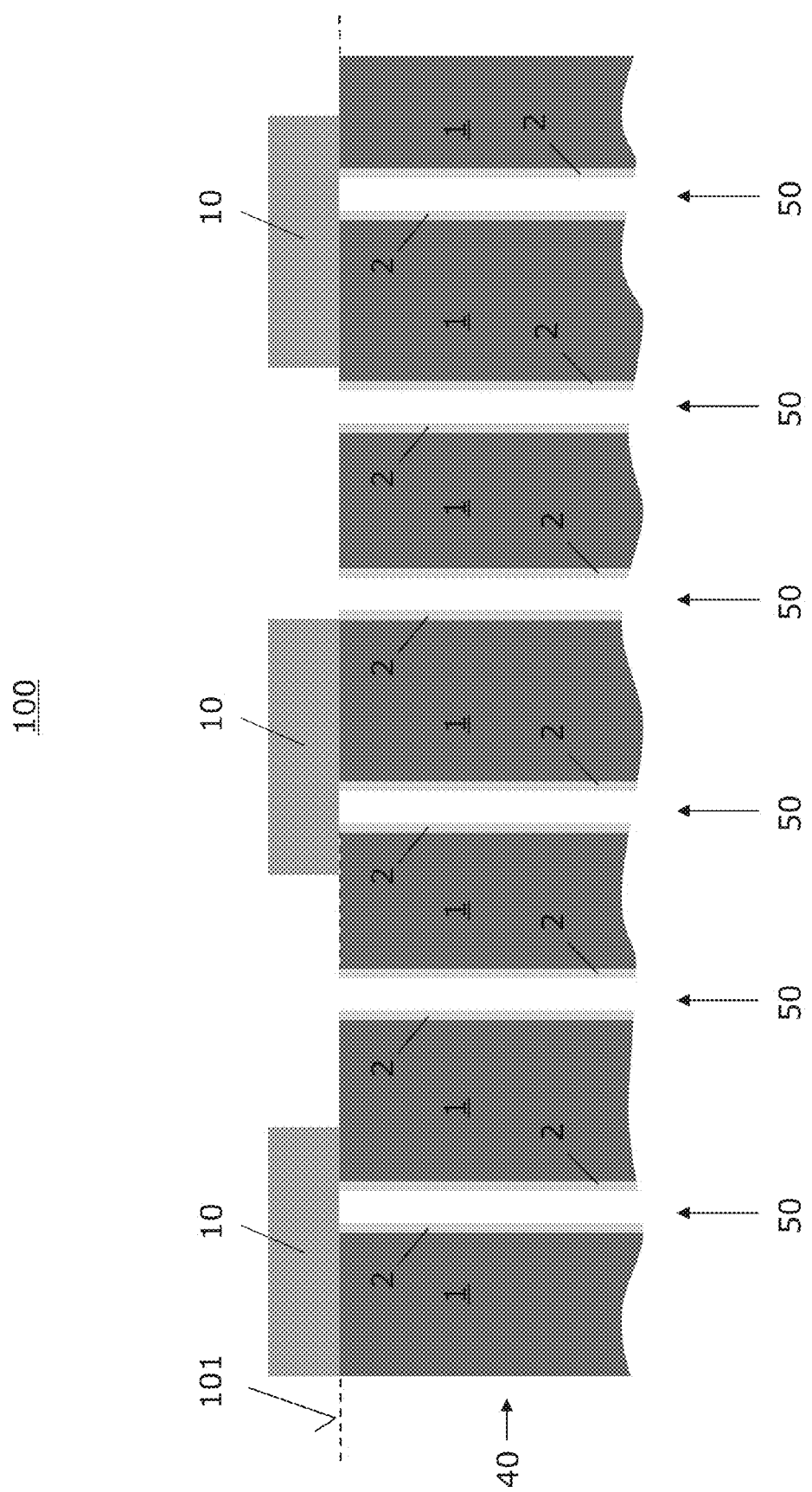

Thereafter, mask 17 is used to etch the first layer 10 thereby forming the first support structure 10. The resulting structure is illustrated in FIG. 4. Note that all semiconductor mesas 1 are typically bridged by the first support structure 10. Accordingly, semiconductor mesas 1 which are not bridged by the first support structure 10 in the vertical cross-section of FIG. 4 are typically bridged in one or more different vertical cross-section. Accordingly, the semiconductor mesas 1 are mechanically stabilized.

The vertical extension of the first support structure 10 is, depending on material properties and geometry, typically in a range from about 100 nm to about 5 μm, more typically from about 0.5 μm to about 1.5 μm to provide a sufficiently large mechanical stabilization of the mesas 1.

This facilitates further processing of the side walls of the semiconductor mesas 1 and the trenches 50, respectively, without increasing the risk of breaking off the mesas 1 and/or irreversibly forming firm contacts between adjacent mesas 1.

Figure 5:
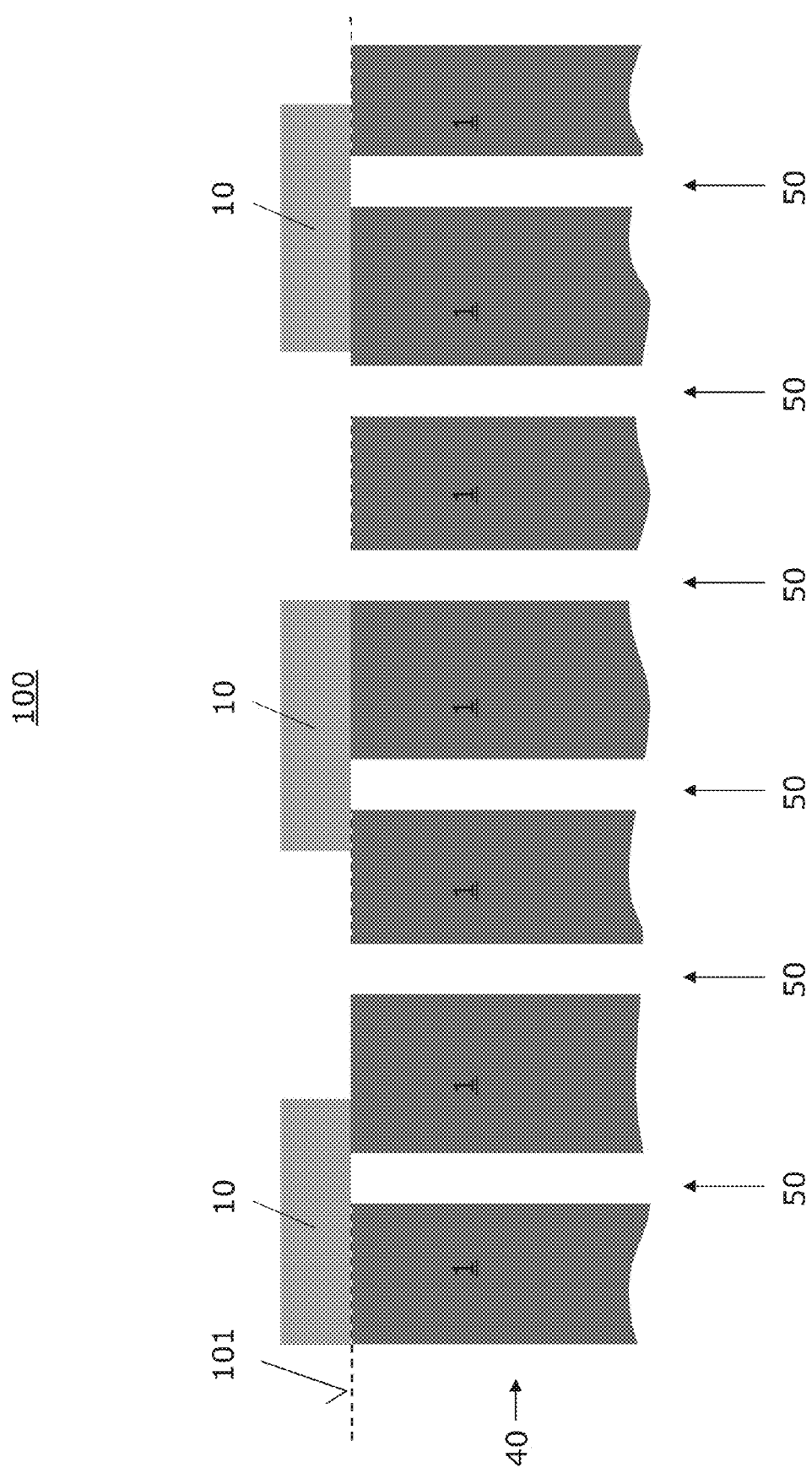

For example, the non-semiconductor regions 2 may be etched selectively to the first support structure 10 and the semiconductor mesas 1. This may be done by wet-chemical etching. The resulting semiconductor device 100 is illustrated in FIG. 5.

Figure 6:
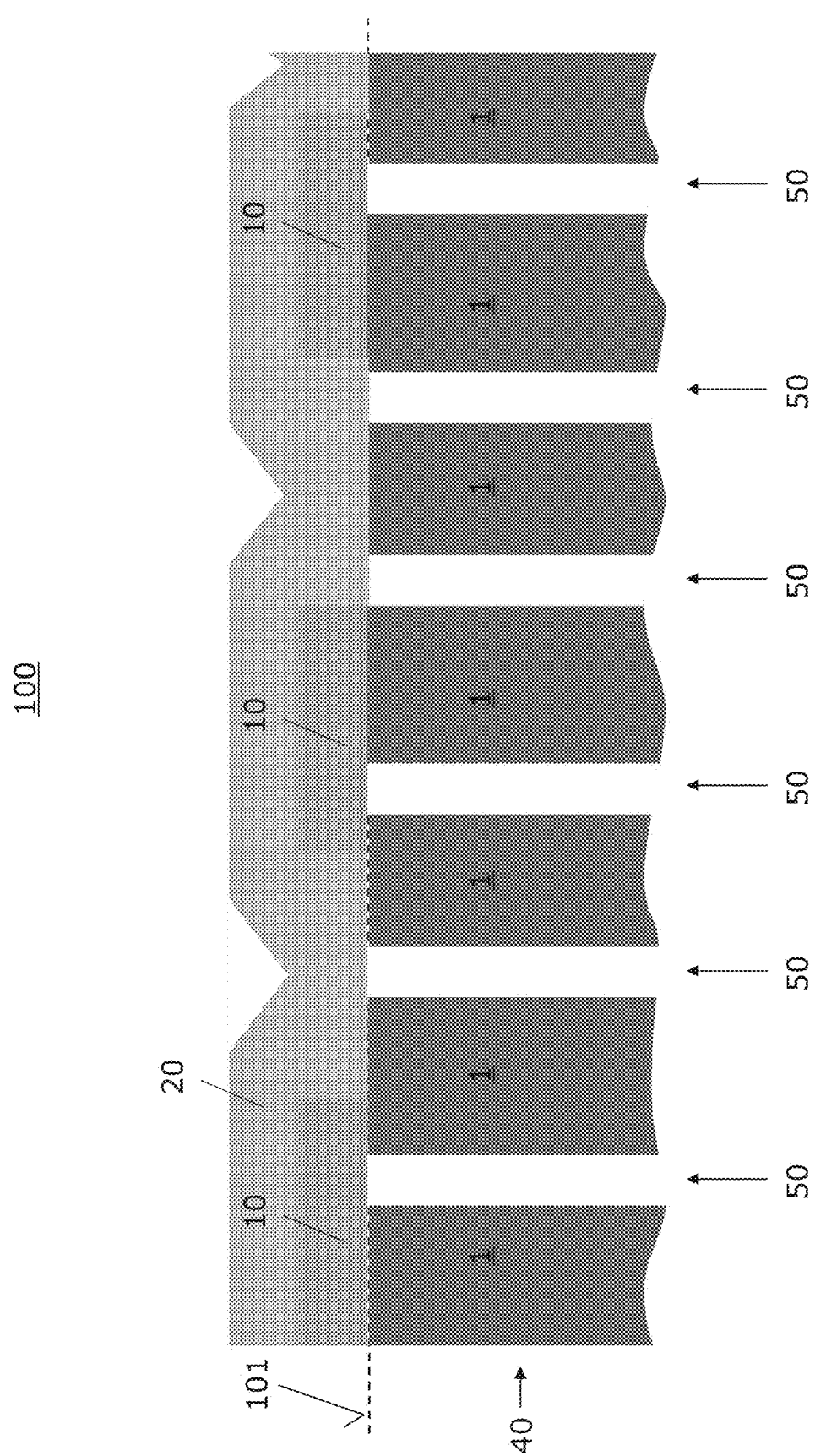

Thereafter, a second support structure 20 of a second material is typically formed on the semiconductor mesas 1. As illustrated in FIG. 6, forming the second support structure 20 typically includes forming a second layer 20 of the second material which adjoins the semiconductor mesas 1 at the upper surface 101. Similar as explained above for the first layer 10, the second layer 20 typically adjoins all semiconductor mesas 1 and is substantially arranged only above the plurality of semiconductor mesas 1. Accordingly, the trenches 50 remain substantially free of the second material. This facilitates further processing.

The second layer 20 is typically formed as a non-conformal layer using, for example, a CVD-process, more typically a PECVD-process. For example, the second layer 20 may be formed as a non-conformal USG-Layer (Undoped-Silicate-Glass-layer) or TEOS-layer (Tetra-Ethyl-Ortho-Silicate-layer) using a CVD-process.

Figure 7:
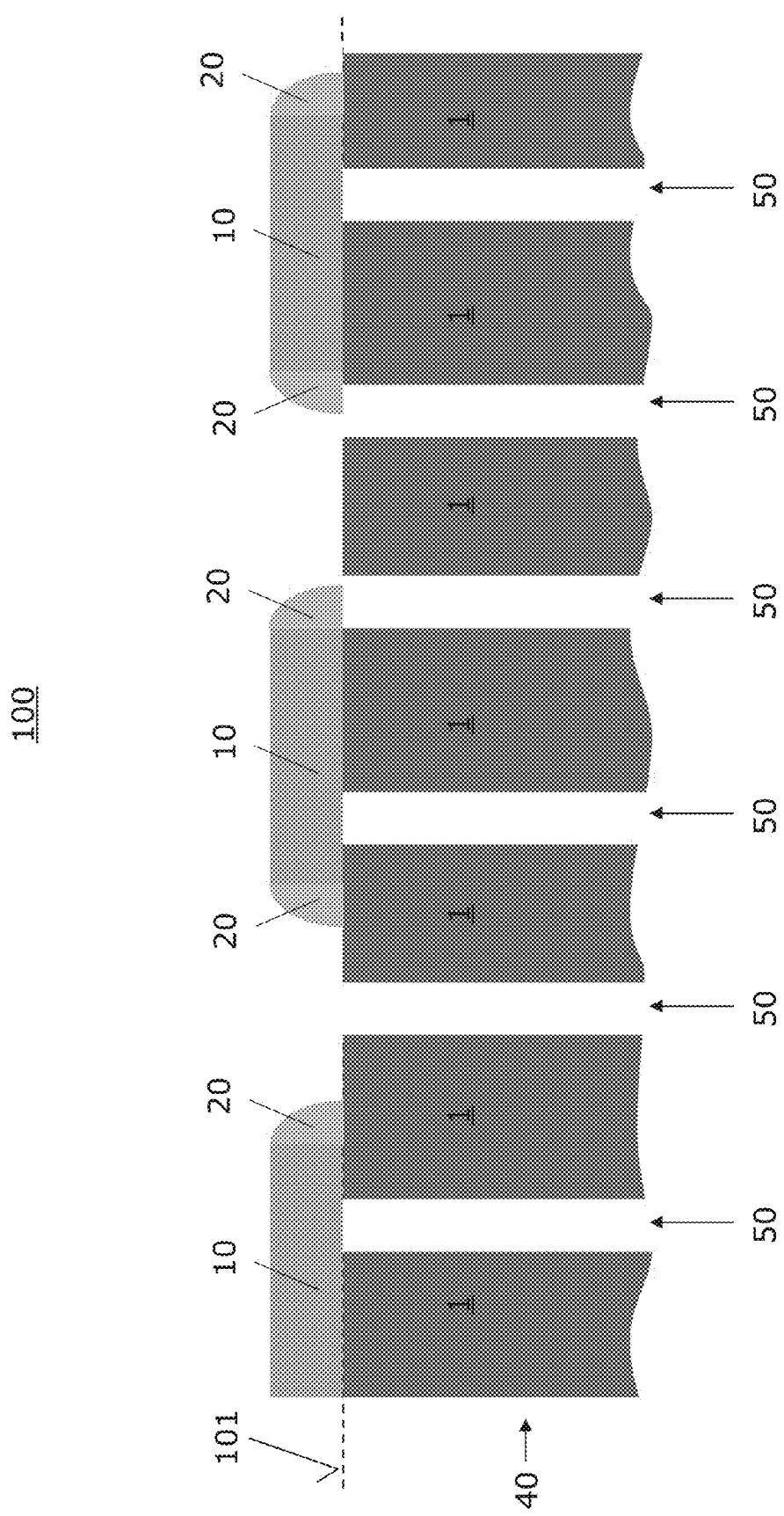

FIG. 7 illustrates the structure after a subsequent unmasked non-isotropic selective etching process, for example by plasma etching, of the second layer 20. Accordingly, a second support structure 20 which bridges adjacent pairs of the semiconductor mesas 1 is formed in a self-adjusted manner with respect to the first support structure 10. Accordingly, no further photolithographic processes are required.

The vertical extension of the second support structure 20 is, depending on material properties and geometry, typically in a range from about 100 nm to about 5 μm, more typically in a range from about 0.5 μm to about 1.5 μm to provide sufficient mechanical stability for the mesas 1 when the first support structure is subsequently removed.

As illustrated in FIGS. 10A and 10B in respective plan views on the semiconductor device 100 of FIG. 7, the semiconductor mesas 1 are typically substantially bar-shaped when seen from above. Furthermore, the second support structure 20 typically adjoins the first support structure 10 at this processing stage.

As illustrated in FIG. 10A, the first support structure 10 and the second support structure 20 typically include, when seen from above, bar-shaped portions that are tilted with respect to the semiconductor mesas 1, for example by a respective tilt angle in a range from about 25° to about 90°, more typically in a range from about 45° to about 90°.

As illustrated in FIG. 10B, the first support structure 10 may be formed as a contiguous mesh, for example as a layer 10 with circular, ellipsoidal or polygonal holes which are partly filled with respective portions of the second support structure 20.

Figure 8:
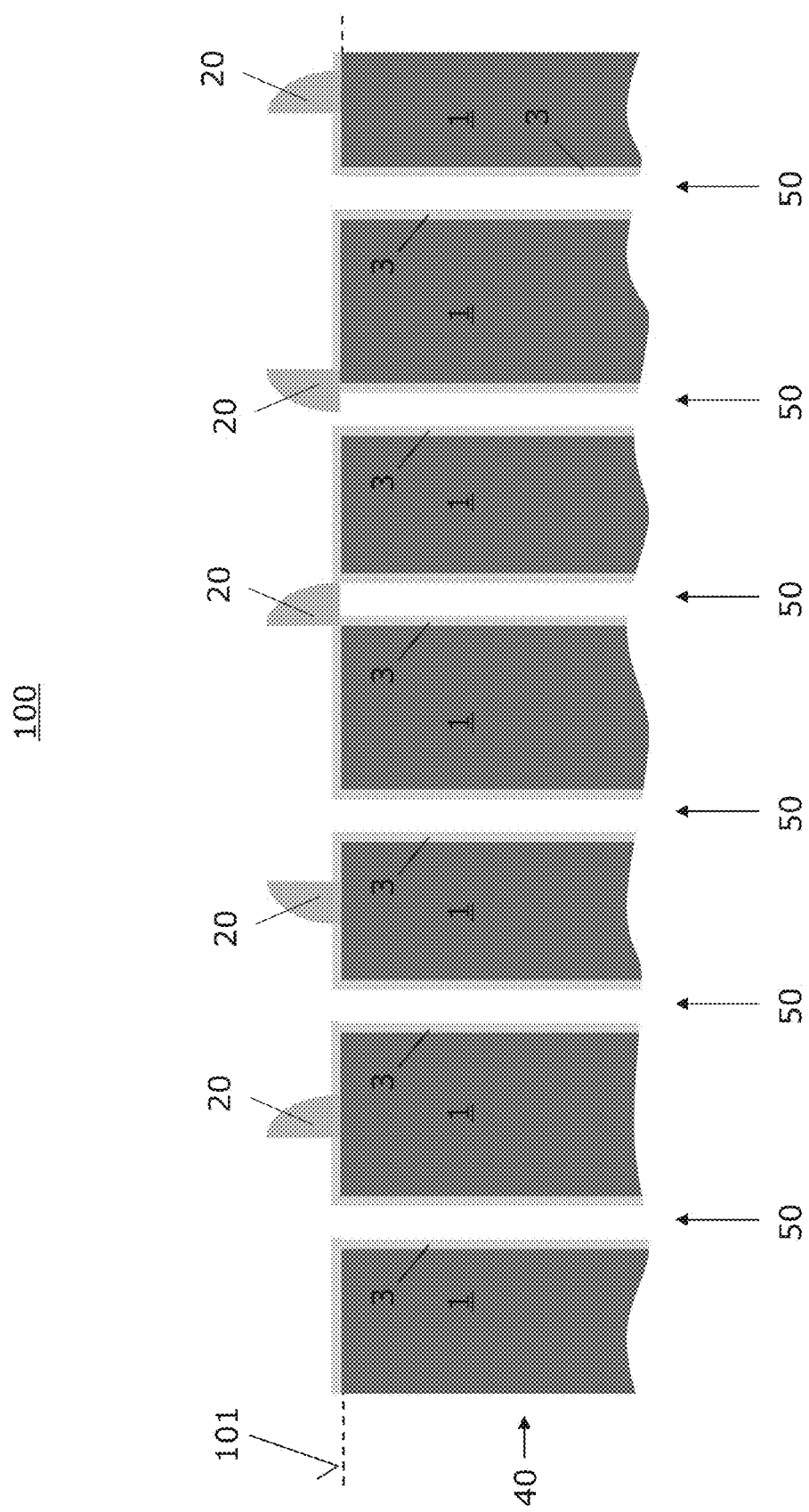

Referring to FIG. 8, a thermal oxidizing process is performed. In this embodiment, both the first support structure 10 is removed by ashing and thermal oxide layers 3 are formed on sidewalls of the semiconductor mesas 1 while the mesas 1 remain mechanically stabilized by the second support structure 20. The thermal oxide layers 3 typically form high quality dielectric layers 3 of low defect density and high breakdown voltage, respectively. Forming high quality dielectric layers 3 is, however, only one example of processing the side wall the semiconductor mesas 1 and/or the side wall or bottom walls of the trenches 50 while the mesas are mechanically supported by at least one of the first support structure 10 and the second support structure 20.

Thereafter, remaining portions of the trenches 50 are typically filled with a dielectric, semiconducting or conducting material 4. Now, the wafer is inherently stable and need no longer supporting structures on the upper surface 101 to mechanically stabilize the semiconductor mesas 1.

Typically, the semiconductor mesas 1 are stabilized without causing substantial additional wafer bow during processing the trenches 50 and semiconductor mesas 1, respectively. This may be achieved by appropriate material selection and deposition conditions for forming the first and second support structures 10, 20. For example, when a thermal oxide is to be formed at the mesa sidewalls, the second support structure 20 may be made of a non-oxidizable material such as silicon oxide, TEOS, USG (Undoped Silicate Glass), silicon nitride or the like and the first support structure 10 may be made of an oxidizable material such as carbon, for example amorphous carbon or diamond-like carbon. During a common thermal oxidizing, the first support structure 10 is removed and the second the second support structure 20 stabilizes the semiconductor mesas 1 without adding substantial additional mechanical stress. Thus, the process is neutral with respect to wafer bow. Note that thermal stress during thermal oxidizing may in addition be reduced, in particular for thin wafers, by a corresponding additional layer of the material of the second support structure 20 on the back-side of the wafer.

The materials of the first support structure 10 and the second support structures 20 may also be selectively etchable to each other. For example, the first support structure 10 may be made of silicon-nitride, an imide, or silicon that is, for removing the first support structure 10, selectively etched with respect to the second support structure 20 made of a different material such as a silicon oxide.

Figure 9:
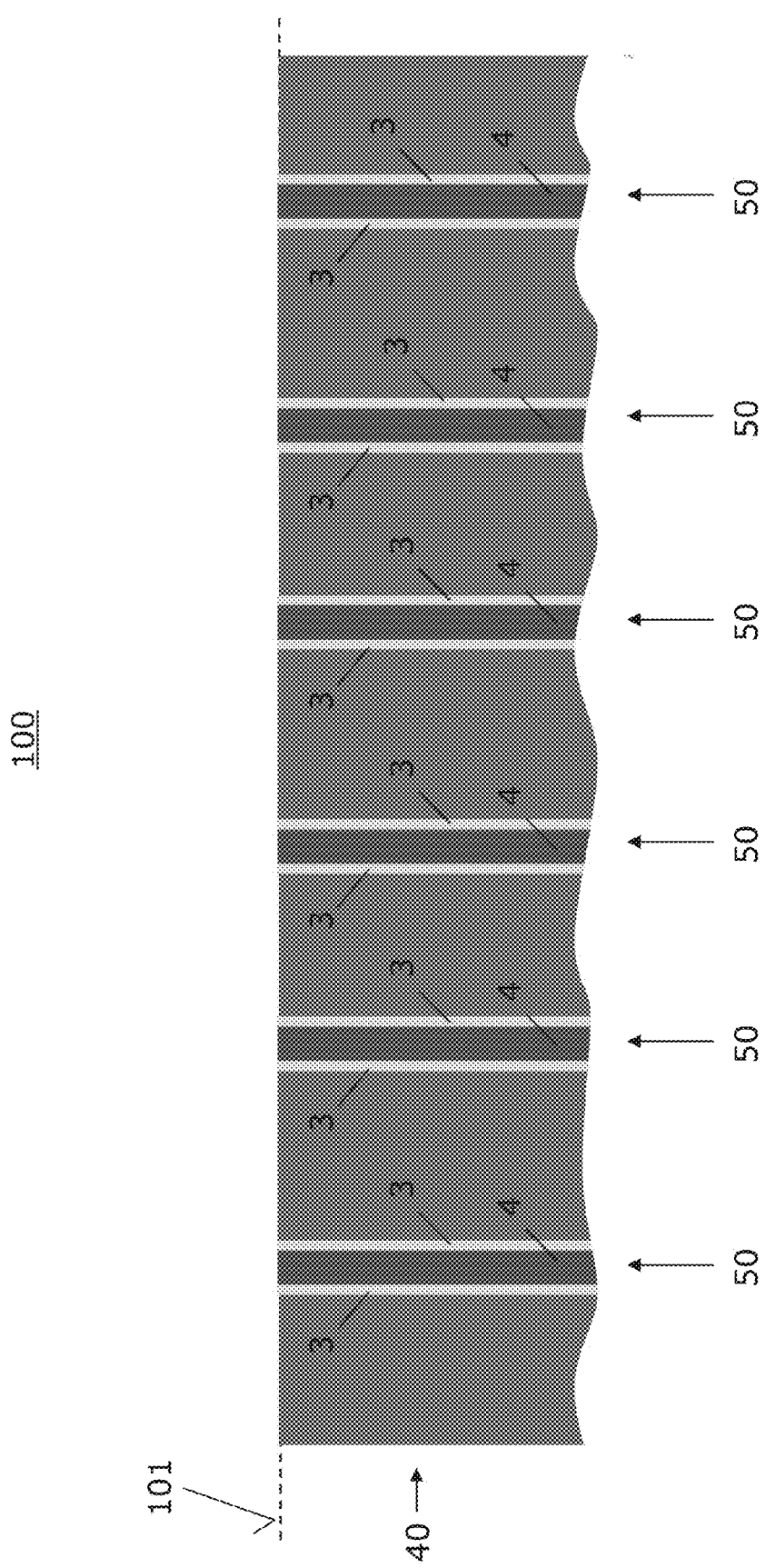
Figure 10:
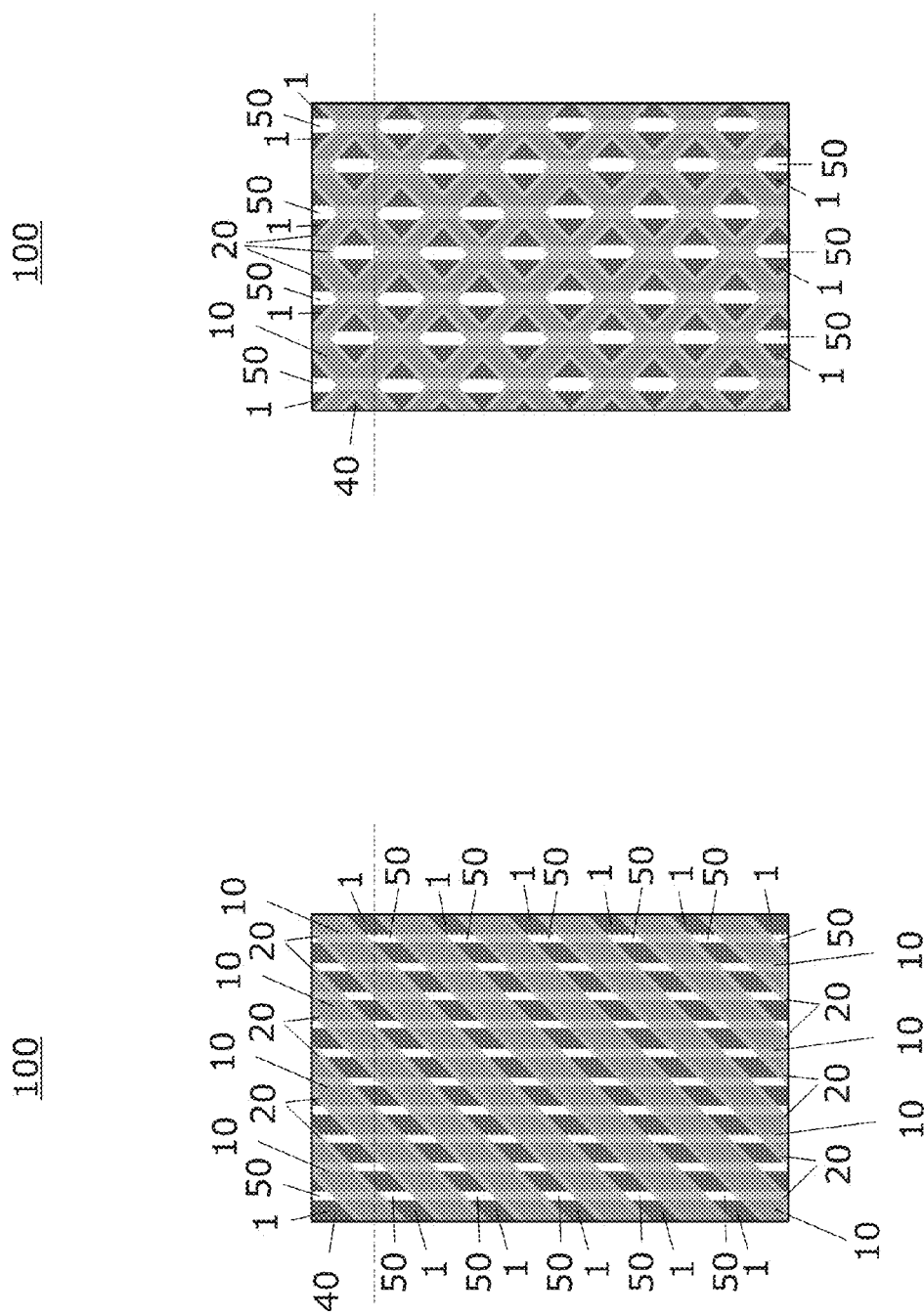
FIGS. 10A and 10B illustrate plan views on a semiconductor body as illustrated in FIG. 7 according to embodiments.

Thereafter, the second support structure 20 may be removed. The resulting structure is illustrated in FIG. 9. Typically, the second support structure 20 is removed by polishing, etching, and/or a CMP-process (Chemical Mechanical Polishing).

Thereafter, further processes of forming several doping regions in the semiconductor mesas 1, forming insulated gate electrodes next to the upper surface 101 and the like may be performed to form a field-effect semiconductor device.

Due to using the first and second support structures 10, 20, semiconductor devices such as TEDFETs with trenches 50 and dielectric regions 3, respectively, having high aspect ratios of more than about 10, more typically more than about 20, for example up 1000 may safely be manufactured.

Referring to FIGS. 11 to 20 illustrating vertical cross-sections through a semiconductor body or wafer 40, method steps of a method for forming a semiconductor device 200 are explained. In a first process, the wafer 40 having an upper surface 101 and a semiconductor layer 1 extending to the upper surface 101 is provided.

Thereafter, wide trenches 51 are etched from the upper surface 101 into the semiconductor layer 1 to form first semiconductor mesas 1 having sidewalls.

Thereafter, sacrificial oxide layers (sacrificial dielectric layers) 2 may be formed on the on the sidewalls of the first semiconductor mesas 1 and wide trenches 51, respectively.

Figure 11:
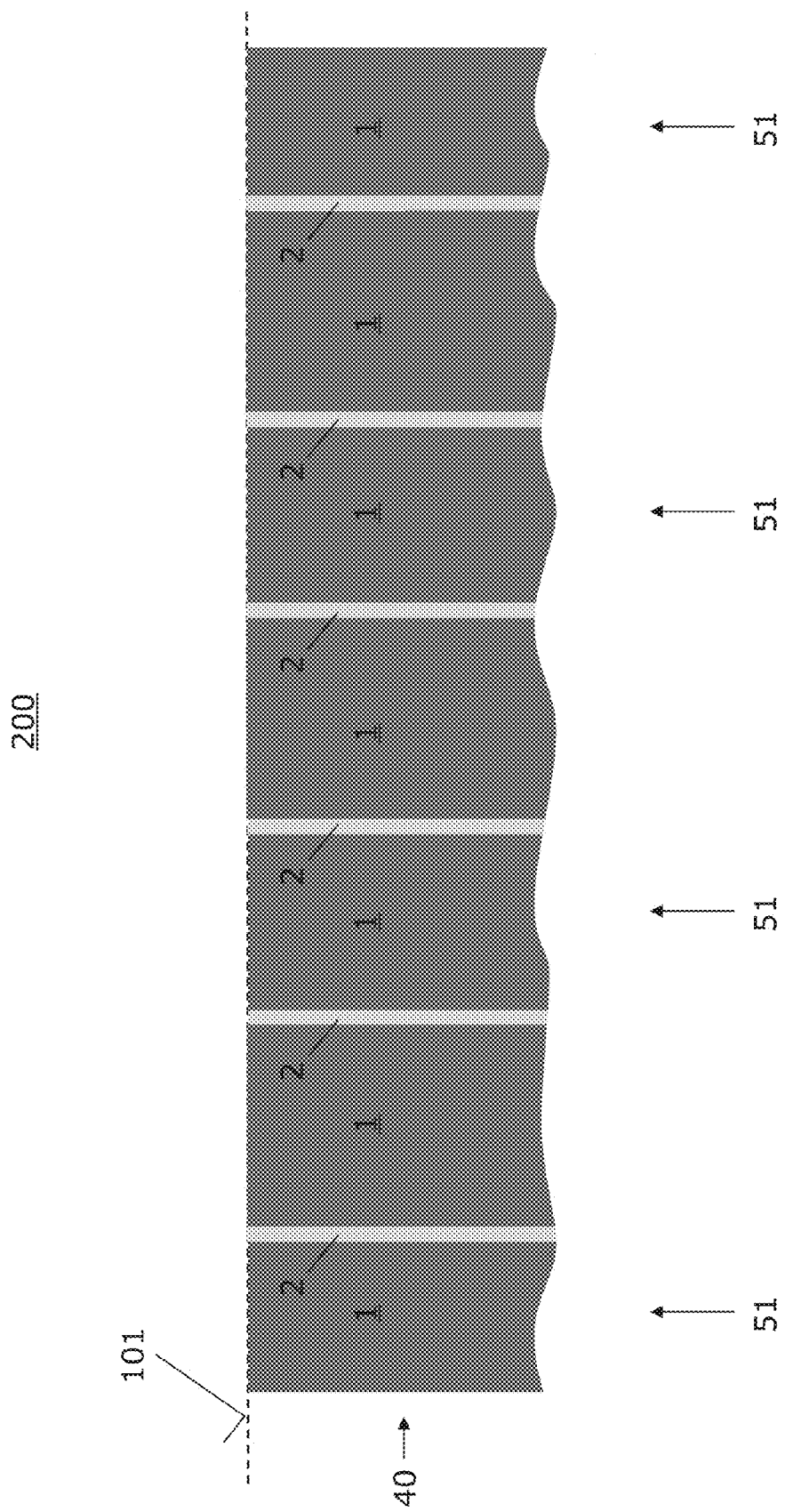
FIGS. 11 to 20 illustrate vertical cross-sections through a semiconductor body during method steps of a method according to further embodiments.

Thereafter, a selective epitaxial growth process may be performed to form second semiconductor mesas 1 in the wide trenches 51 between adjacent sacrificial oxide layers 2. The resulting structure is illustrated in FIG. 11.

Thereafter, a first support structure 10 of an oxidizable material such as amorphous carbon or diamond-like carbon is formed on the upper surface 101 so that adjacent pairs of the first and second semiconductor mesas 1 are bridged by the first support structure 10. This may be done similar as explained above with regard to FIGS. 2 to 4.

Figure 12:
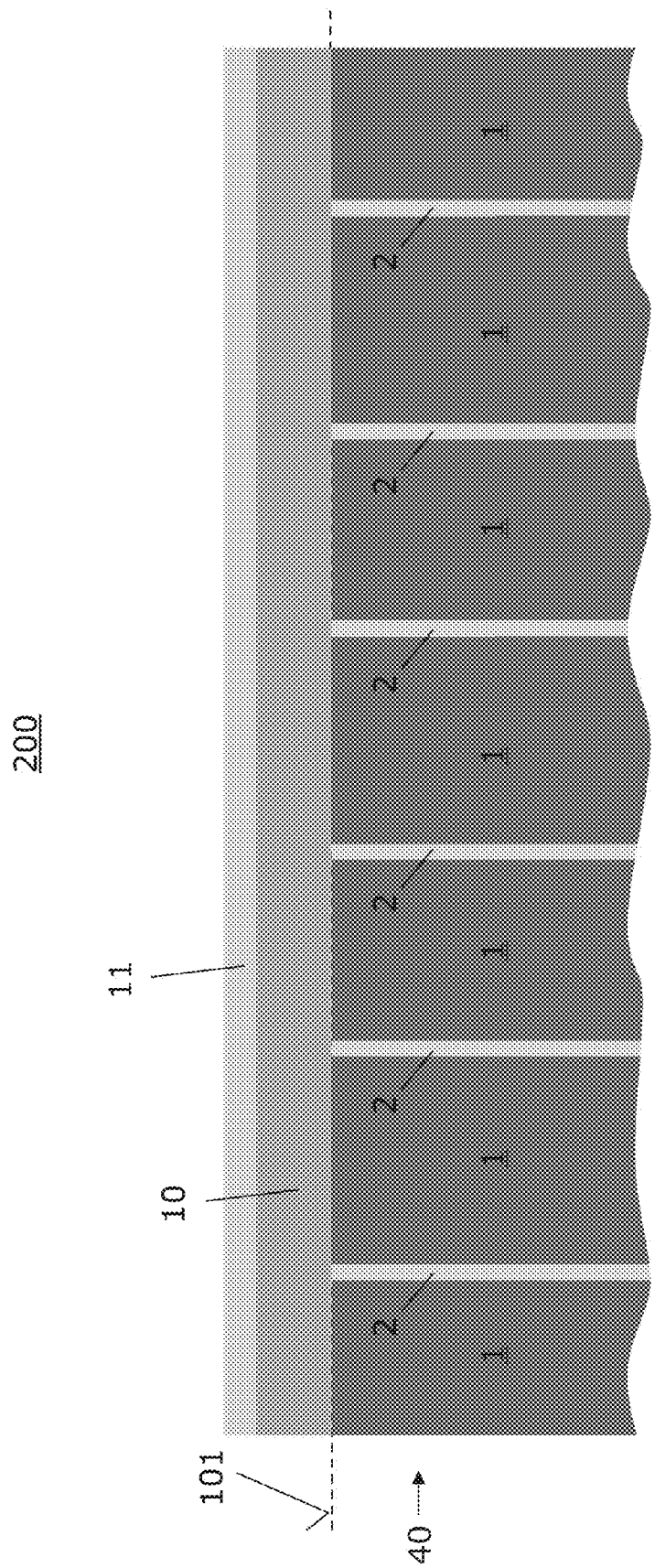

For example, a first layer 10 of amorphous carbon may be deposited on the first and second mesas 1 in a CVD-process and hard-mask layer 11 of e.g. silicon oxide may be deposited on the first layer 10. The resulting structure is illustrated in FIG. 12.

Figure 13:
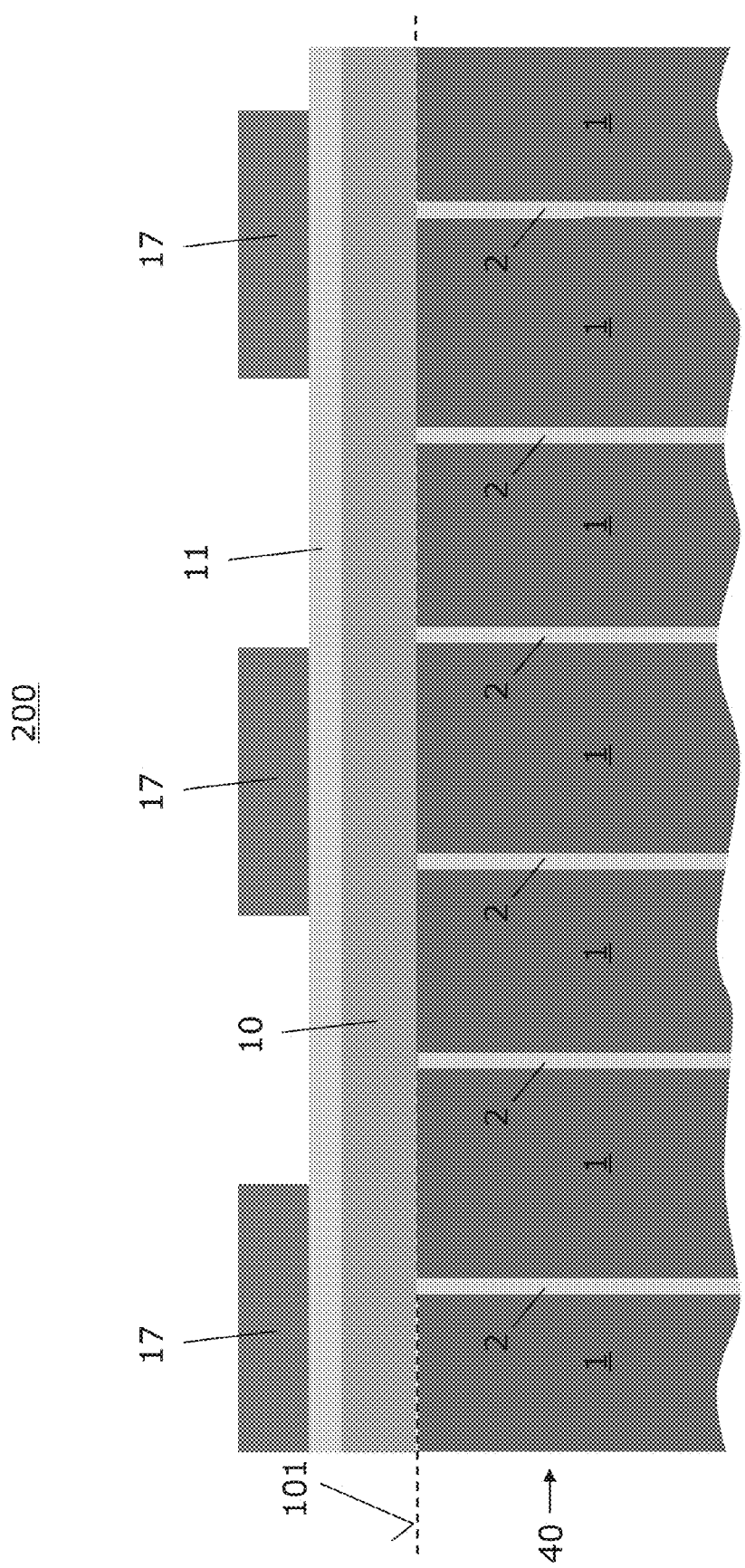

Thereafter, a mask 17 is formed on the hard-mask layer 11 as illustrated in FIG. 13. This typically includes a photo-lithographic process.

Figure 14:
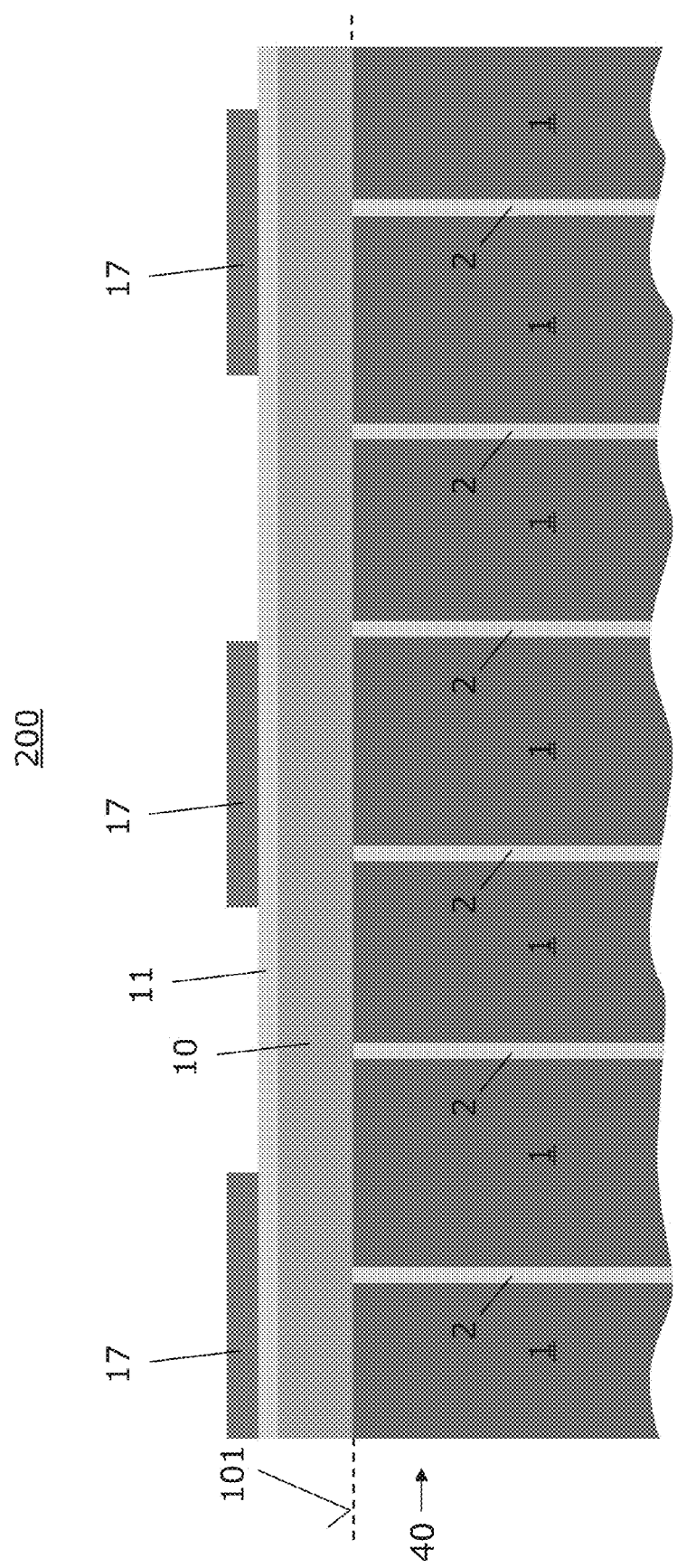

Thereafter, mask 17 is used to etch the hard-mask layer 11 thereby forming a hard-mask 11. The resulting structure is illustrated in FIG. 14.

Figure 15:
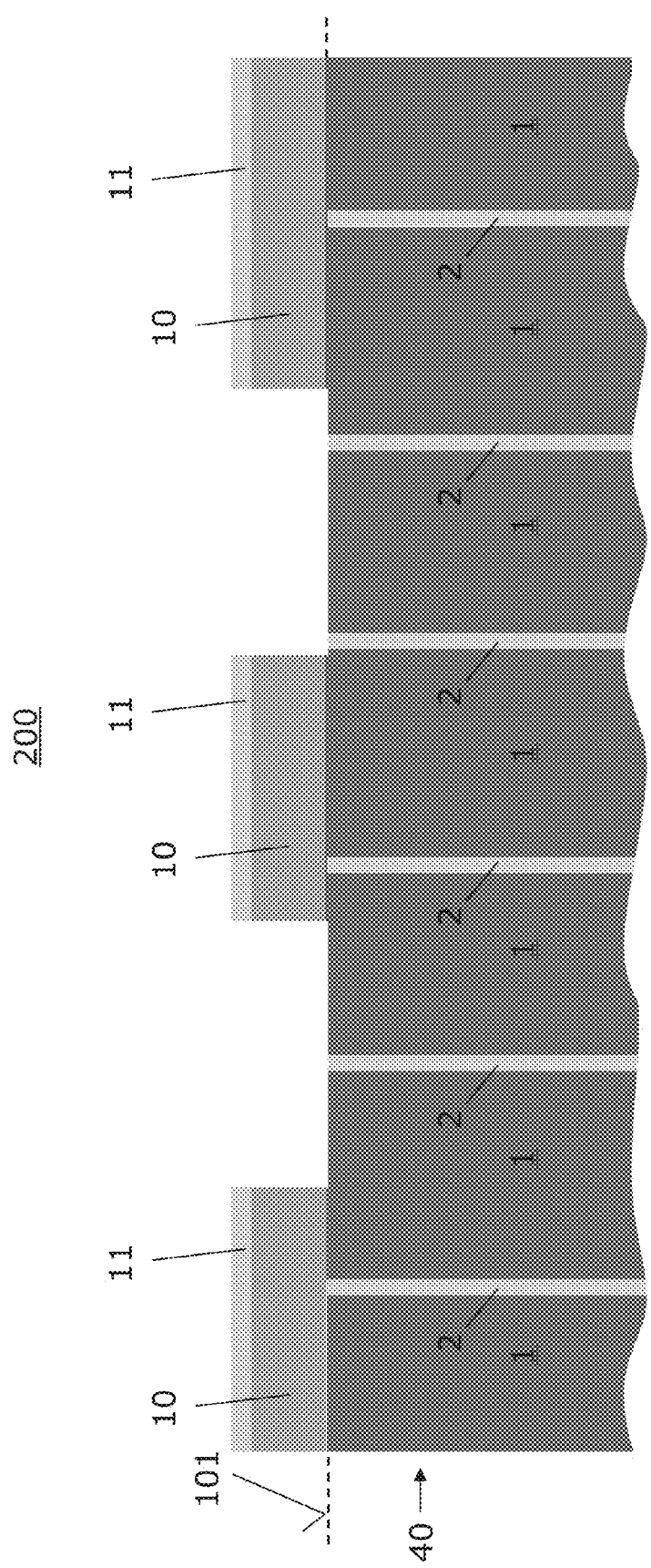

Thereafter, the hard-mask 11 is used to etch the first layer 10 thereby forming a first support structure 10. The resulting structure is illustrated in FIG. 15. Note that all semiconductor mesas 1 are typically bridged by the first support structure 10. Thereafter, the hard-mask 11 may be removed.

Figure 16:
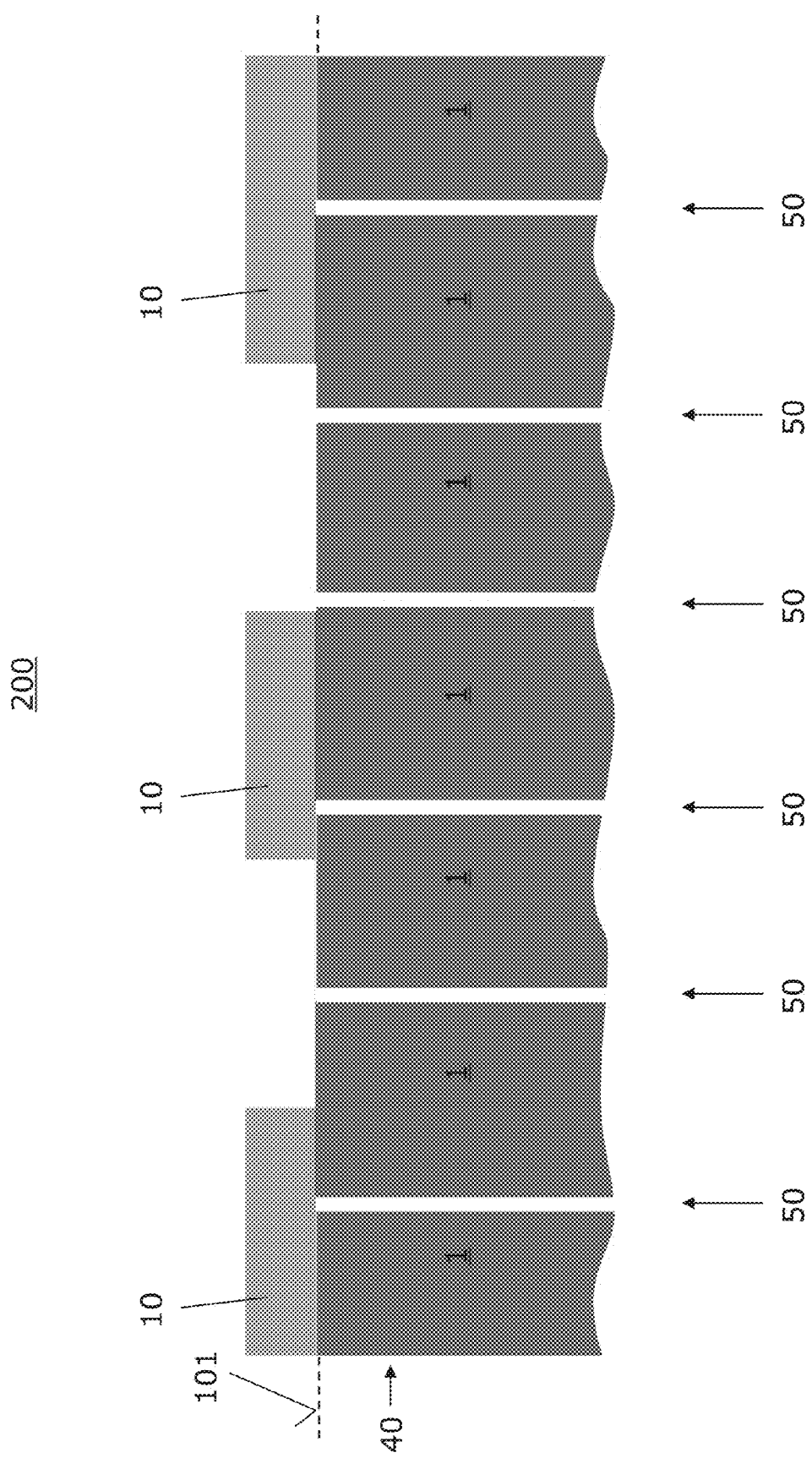

Thereafter, the sacrificial oxide layers 2 may be removed by etching to expose sidewalls of the first and second semiconductor mesas 1. In so doing vertical trenches 50 are formed between the first and second mesas 1. The resulting structure 200 is illustrated in FIG. 16. The first support structure 10, 20 mechanically stabilize the first and second semiconductor mesas 1 during removing the sacrificial oxide layers 2 and typically also during further subsequent processes.

Figure 17:
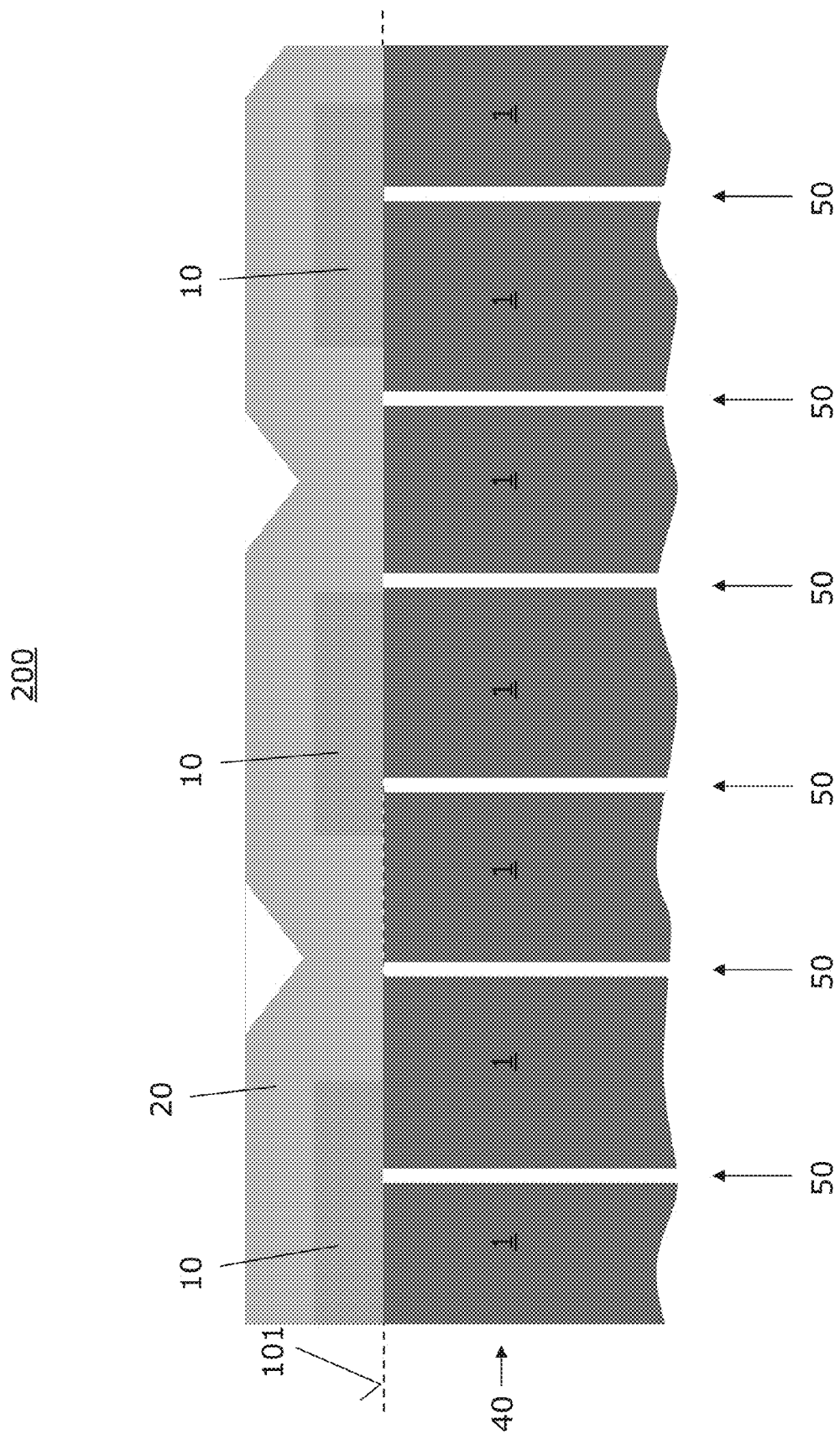

Thereafter, a second support structure 20 of a second material is typically formed on the first and second semiconductor mesas 1. As illustrated in FIG. 17, forming the second support structure 20 typically includes forming a second layer 20 of the second material which adjoins the semiconductor mesas 1 at the upper surface 101.

The second layer 20 is typically formed as a non-conformal layer using, for example, a CVD-process. For example, the second layer 20 may be formed as a non-conformal USG-Layer (Undoped-Silicate-Glass-layer) or TEOS-layer (Tetra-Ethyl-Ortho-Silicate-layer) using a CVD-process.

Figure 18:
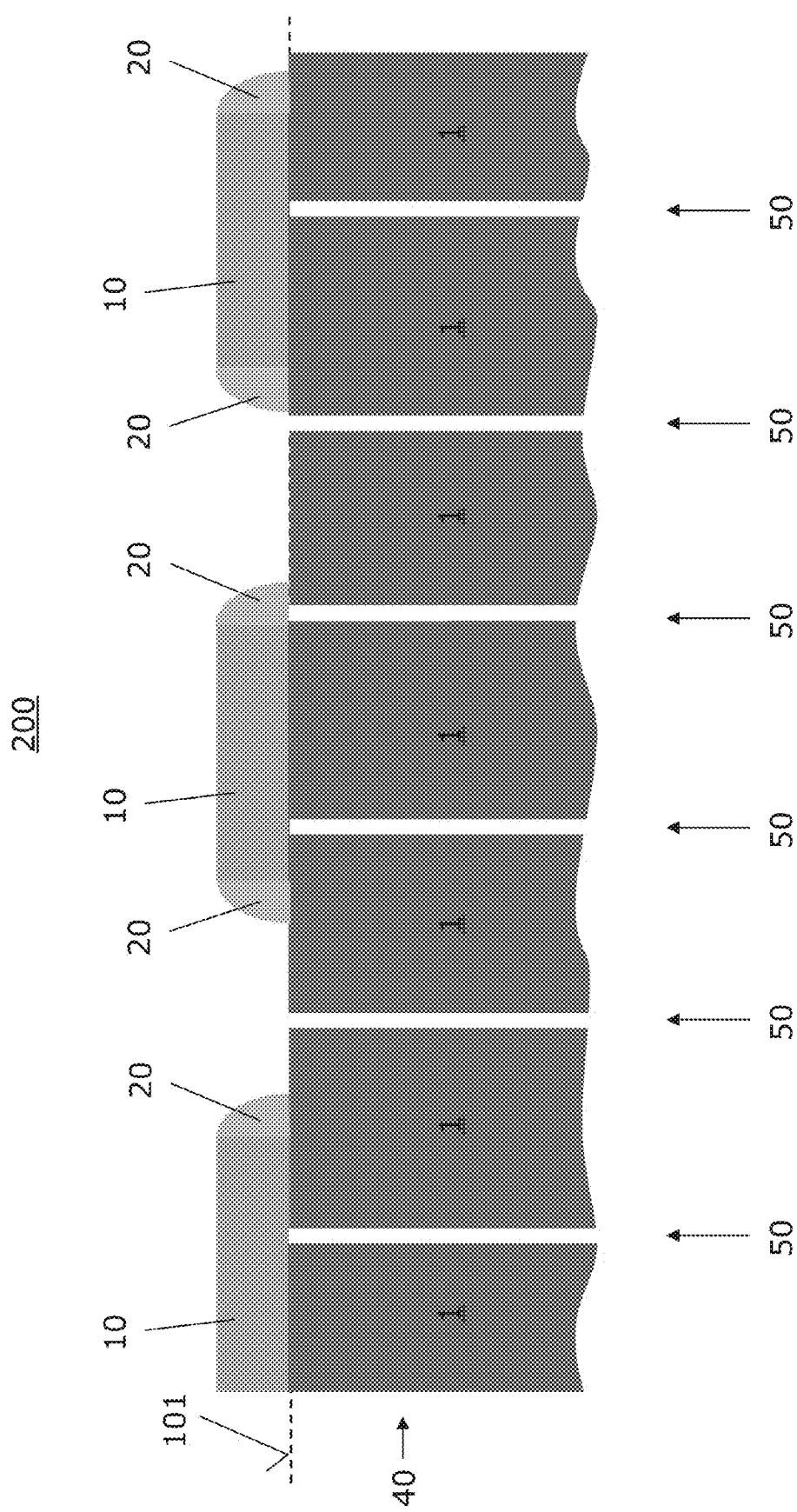

FIG. 18 illustrates the structure after a subsequent unmasked non-isotropic selective etching process of the second layer 20. Accordingly, a second support structure 20 which bridges adjacent pairs of the semiconductor mesas 1 is formed in a self-adjusted manner with respect to the first support structure 10.

Similar as explained above, the first support structure 10 and the second support structure 20 typically adjoin all semiconductor mesas 1 and are substantially arranged only above the plurality of semiconductor mesas 1. Accordingly, the trenches 50 remain substantially free of the materials of the first support structure 10 and the second support structure 20. This facilitates further processing.

When seen from above the first support structure 10 and the second support structure 20 may include adjoining bar-shaped portions that are tilt with respect to the first and second semiconductor mesas 1 similar as explained above with regard to FIG. 10A.

The first support structure 10 may also be formed as a contiguous mesh 1 similar as explained above with regard to FIG. 10B.

Figure 19:
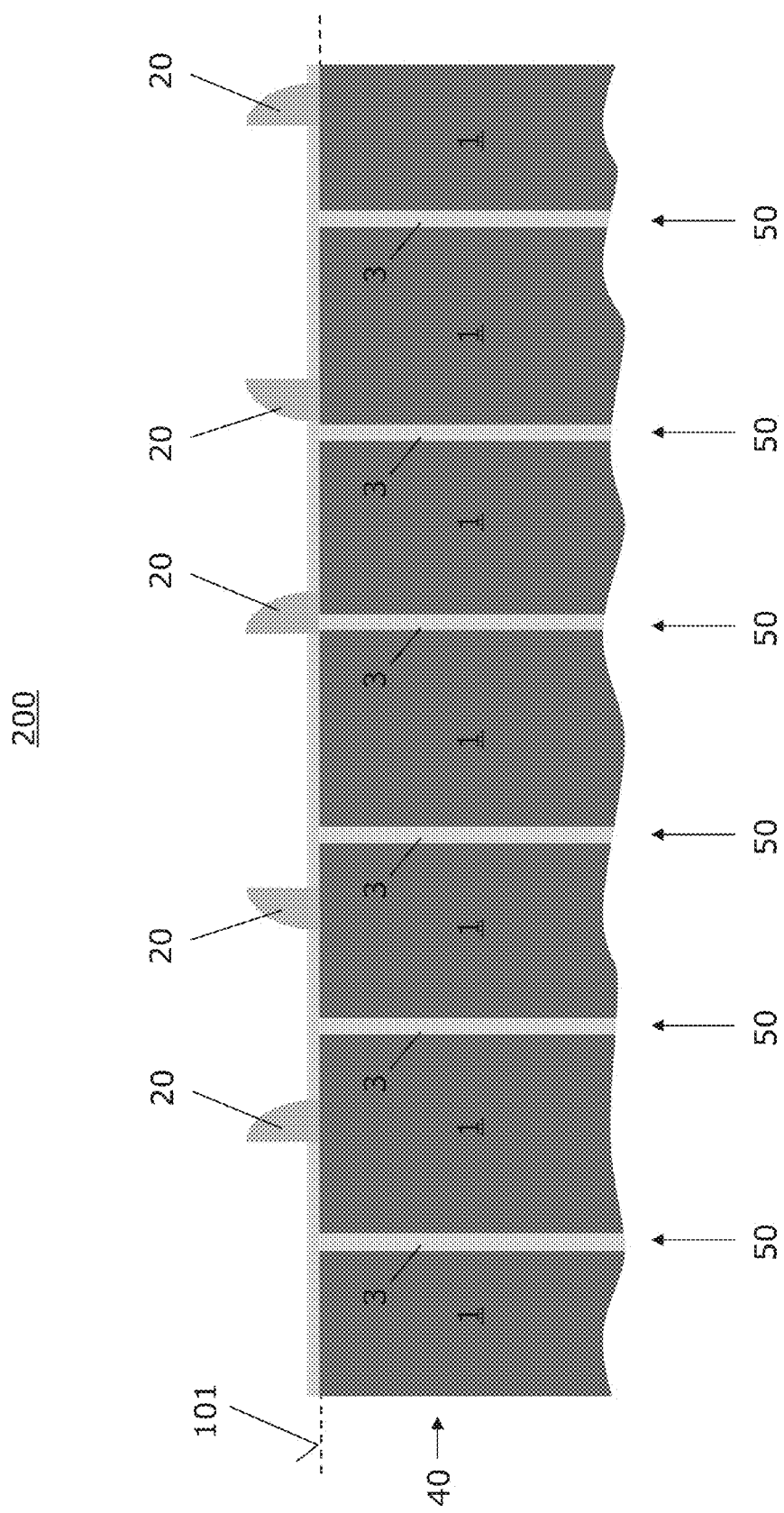

Thereafter, a common thermal oxidizing process may be performed to fill the vertical trenches 50 with a high quality thermal oxide layers 3 and to remove the first support structure 10 by ashing. During the growth of the thermal oxide layers 3 at the sidewalls of the first and second semiconductor mesas 1, the first and second semiconductor mesas 1 are mechanically stabilized by the second support structures 20. The resulting structure 200 is illustrated in FIG. 19.

Figure 20:
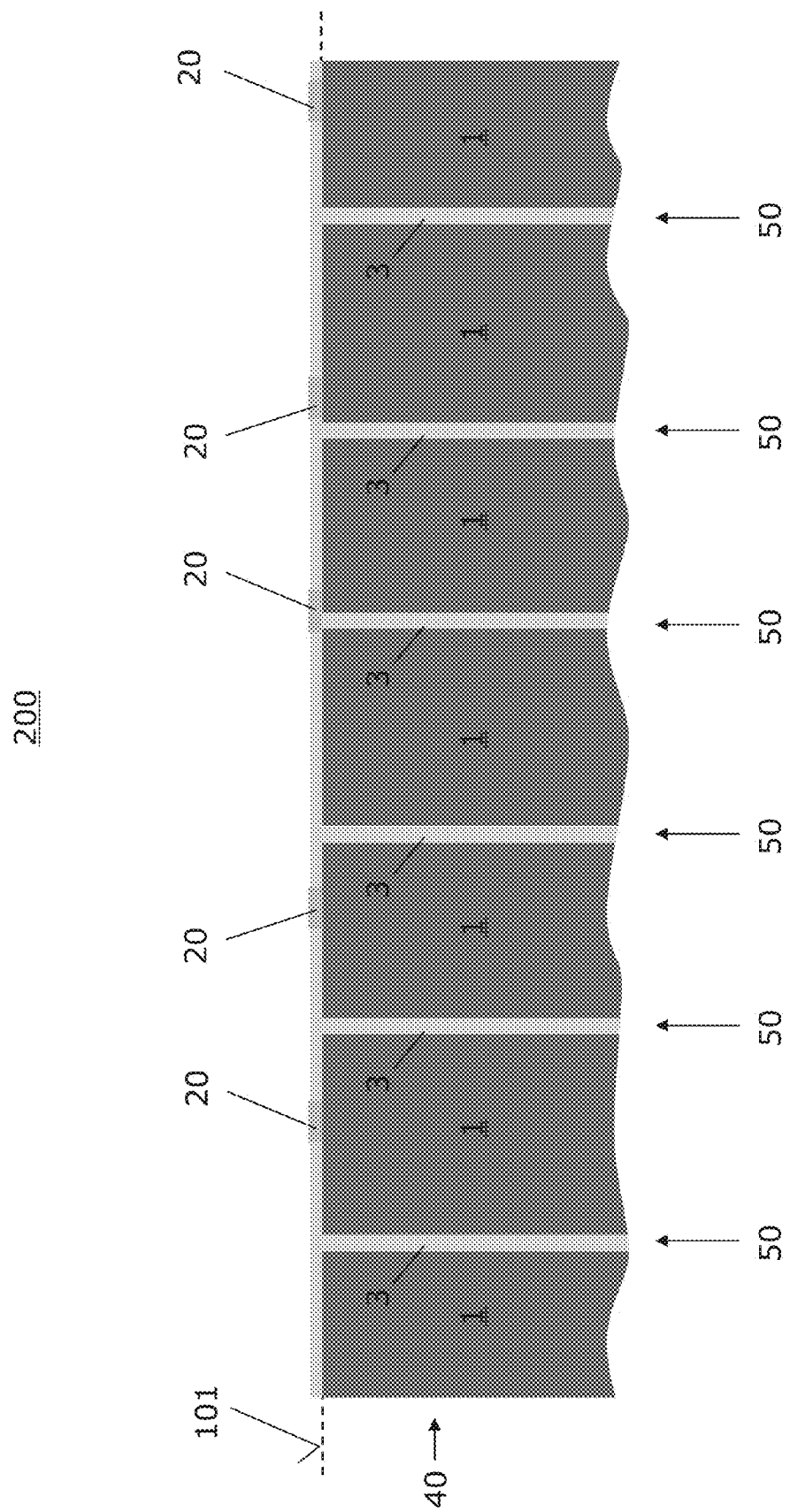

Thereafter, the second support structure 20 may be partly removed from the upper surface 101. The resulting structure is illustrated in FIG. 20. This may be done by polishing, etching, and/or a CMP-process. Note that the second support structure 20 and the thermal oxide 3 may also be completely removed from the upper surface 101.

Thereafter, further processes of forming several doping regions in the semiconductor mesas 1, forming insulated gate electrodes next to the upper surface 101 and the like may be performed to form a field-effect semiconductor device such as a TEDFET.

The methods for forming the semiconductor devices 100, 200 explained above with regard to FIGS. 1 to 10 and 11 to 20 may also be describe as providing in a first process a wafer having an upper surface 101 and a plurality of semiconductor mesas 1 extending to the upper surface 101.

According to an embodiment, the wafer is provided with trenches 50 extending from the upper surface 101 into the wafer and between respective pairs of semiconductor mesas 1. The trenches 50 may already at least partly be filled with respective dielectric regions 2, for example with respective carbon-layers or sacrificial silicon oxide layers covering sidewalls of the semiconductor mesas 1 and/or completely filling the vertical trenches.

Thereafter, a first support structure 10 made a first material and adjoining the plurality of semiconductor mesas 1 at the upper surface 101 is typically formed such that adjacent pairs of the semiconductor mesas 1 are bridged by the first support structure 10 and that the first support structure 10 is substantially arranged only above the upper surface 101.

Thereafter, a second support structure 20 made of a second material and adjoining the plurality of semiconductor mesas 1 at the upper surface 101 is formed such that the adjacent pairs of the semiconductor mesas 1 are bridged by the second support structure 20 and that the second support structure 20 is substantially arranged only above the upper surface 101. The second material is different from the first material. For example, the first material may be an oxidizable material such as carbon, diamond-like carbon or silicon and the second material may be a non-oxidizable material such silicon oxide, silicon nitride or USG. The second material may also be selectively etchable against the first material.

The first and second support structure 10, 20 stabilizes the semiconductor mesas 1 during further processing, for example during further processing side walls of the semiconductor mesas 1 to form high quality dielectric regions 3 between adjacent mesas 1. Accordingly, the breaking off mesas 1 and/or irreversible forming firm contacts between adjacent mesas 1 may be avoided. This facilitates forming of semiconductor devices such as TEDFETs with smaller pitch and/or higher aspect ratio of semiconductor mesas 1 and trenches 50, respectively.

The second support structure 20 is typically formed in a self-aligned manner with respect to the first support structure 10. In so doing, only one lithographical process is required to form the first and second support structures 10, 20.

Note that further support structures may be formed in a self-aligned manner with respect to the first support structure 10 and/or second support structure 20. This increases flexibility of manufacturing without using additional photo masks.

Furthermore, the first support structure 10 and the second support structure 20 may be formed and at least partly removed at different manufacturing stages. For example, the first support structure 10 may be removed prior to or during forming the high quality dielectric regions 3 between adjacent mesas 1, while the second support structure 20 is completely or partly removed thereafter. This increases flexibility of manufacturing and facilitates processing of high aspect ratio trenches and mesas.

The second support structure 20 and the first support structure 10 are typically only formed substantially above the plurality of semiconductor mesas 1. Accordingly, the mesas 1 are stabilized without filling the trenches 50. Non-conformal first and second layers 10, 20 may deposited and subsequently etched to form the first support structure 10 and the second support structure 20, respectively.

For example, the second support structure 20 is formed using a CVD-process to form a non-conformal layer and an un-isotropic etching process or recess-etching of the non-conformal layer.

Typically, the materials and/or vertical extensions and/or deposition conditions of the first support structure 10 and the second support structure 20 are chosen such that the wafer bow is not or almost not changed when the first support structure 10 and/or the second support structure 20 are arranged on the upper surface 101. In embodiments referring to thin wafers, respective layers may also be arranged on a back-side of the wafer to further minimize the influence of the first support structure 10 and the second support structure 20, respectively, on wafer bow.

After finally processing the trenches 50 and regions between the semiconductor mesas 1, respectively, the first support structure 10 and the second support structure 20 may be removed from the upper surface 101 and further processes of, for example, forming field-effect structures in the mesas 1 may be performed at or close to the upper surface 101.

In the following, methods for forming semiconductor devices are explained allowing stabilizing the semiconductor mesas with one support structure only during processing steps in which forces are applied to the semiconductor mesas that may cause at least deflecting the semiconductor mesas. In these embodiments, only one material is typically used for forming the respective support structure.

Figure 21:
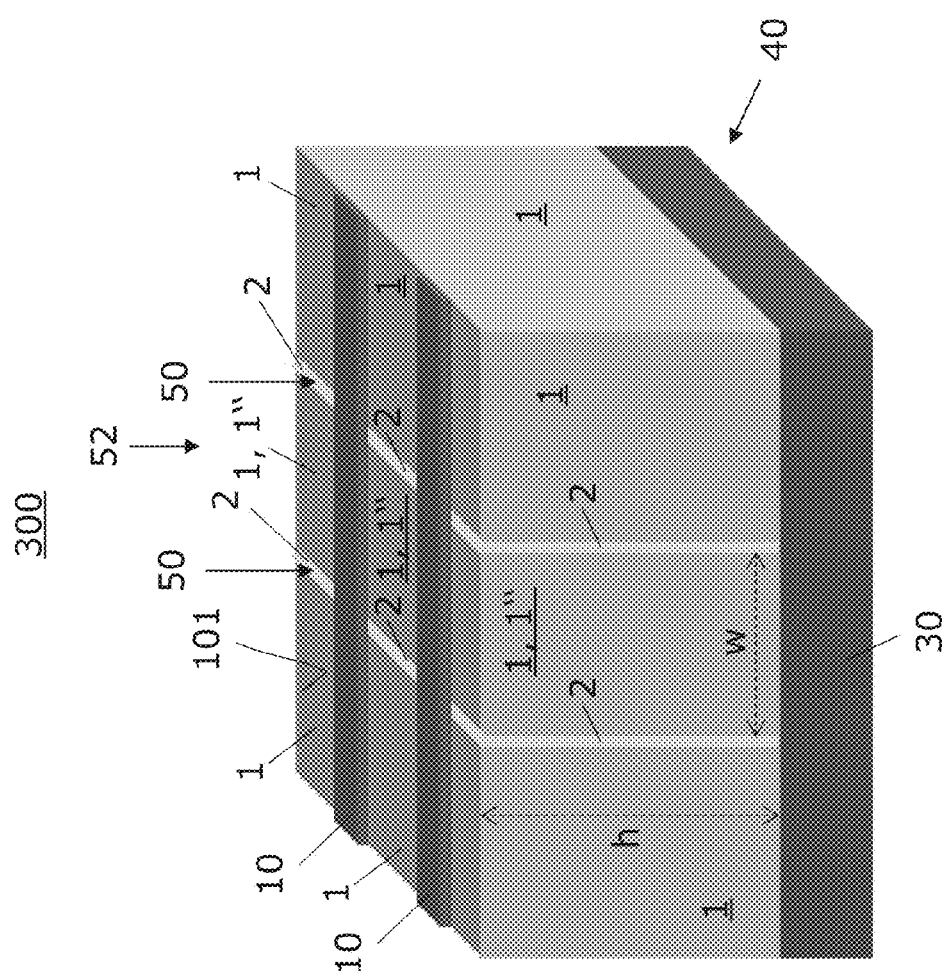
FIG. 21 illustrates a perspective view of a semiconductor body during method steps of a method according to further embodiments.

Referring to FIG. 21, method steps of a method for forming a semiconductor device 300 are explained. FIG. 21 shows a perspective view of a typically small portion of the semiconductor body 40 of the semiconductor device 300 and illustrates a stage after several process steps resulting in a semiconductor substrate 40 having an upper surface 101 and upper side 101, respectively, and a plurality of semiconductor mesas 1 of a first monocrystalline semiconductor material (e.g. monocrystalline silicon) which are spaced apart from each other by sacrificial layers 2 arranged in trenches 50 and extending from the upper side 1 into the semiconductor substrate 40, and after forming on the semiconductor mesas 1 a support structure 10 mechanically connecting each pair of adjacent semiconductor mesas 1 at the upper surface 101. The sacrificial layers 2 are made of a material which is selectively etchable with respect to the first monocrystalline material semiconductor material. The sacrificial layers 2 may be made of a dielectric material (e.g. $SiO_2$), carbon, diamond-like carbon, a photo resist, a polycrystalline semiconductor material, an amorphous semiconductor material or a different monocrystalline material semiconductor material (e.g. $Si_xGe_{1-x}$).

In the exemplary embodiment illustrated in FIG. 21, the semiconductor mesas 1 extend from a common semiconductor substrate 30 to the upper surface 101. For sake of clarity, only three semiconductor mesas 1 are illustrated in FIG. 21. Furthermore, the drawing of FIG. 21 is typically not to scale. For example, trenches 50 (as well as the sacrificial layers 2) may have vertical extensions h of up to several microns (μm) and high aspect ratios h/w of more than about 10, more typically more than about 20 or 50, for example up to about 1000.

The semiconductor device 300 to be manufactured may be a TEDFET. In this embodiment, the method resulting in the structure shown in FIG. 21 may include the following steps performed after each other providing a semiconductor substrate 40 having a semiconductor layer 1 extending to the upper surface 101; etching wide trenches 52 from above into the semiconductor layer 1 so that first semiconductor mesas 1 (left and right ones in FIG. 21) are formed; forming sacrificial layers 2 (e.g. sacrificial dielectric layers 2) at sidewalls of the wide trenches 51 and first semiconductor mesas 1, respectively, for example by thermal oxidation; performing a selective epitaxial growth process to form second semiconductor mesas 1" in the wide trenches 52; an optional CMP-process; and forming the support structure 10 bridging pairs of adjacent semiconductor mesas 1, 1".

Due to the processing, the quality of the sacrificial layers 2 and/or the second semiconductor mesas 1" at the interface to the sacrificial layers 2 may be too low. Therefore, it is often desirable to replace those areas. This typically includes removing the sacrificial layers 2 by etching, to expose sidewalls of the first and second semiconductor mesas 1. In so doing vertical trenches 50 are formed between the first and second mesas 1. If a wet etching is used to form the trenches 50, rinsing and drying is subsequently used. During these steps, the semiconductor mesas 1, 1" are protected against deflecting, bending, breaking and/or forming firm contacts caused e. g. by vibrations or capillary forces.

Thereafter, the trenches 50 may be completely filled with a dielectric material and the support structure 10 at least partly be removed. Typically, the sidewalls and bottom walls of the trenches 50 are thermally oxidized. Accordingly, a high quality dielectric is formed that may be used as accumulation oxide of the TEDFET and possible crystal defects at or close to the sidewalls are removed. In other embodiments, the trenches 50 are only partly filled. For example, the partly filled trenches may include voids to reduce mechanical stress.

In embodiments in which the support structure 10 is made of carbon, diamond-like carbon, or a resist that may be ashed, filling the trenches 50 and removing the support structure 10 may be performed in a common dry-etch process or plasma process.

In other embodiments in which the support structure 10 is formed by a material that cannot easily be removed by ashing, such as poly-silicon or silicon nitride ($Si_3N_4$), the support structure 10 may be removed by etching and/or polishing, for example a CMP-process.

The design of the support structure 10 including the material, the height and the layout when viewed from above may be chosen in accordance with expected mechanical, thermal and/or hydrodynamic loads (magnitude and/or frequency) expected during processing with recessed trench side walls and/or trench bottoms.

Figure 22B:
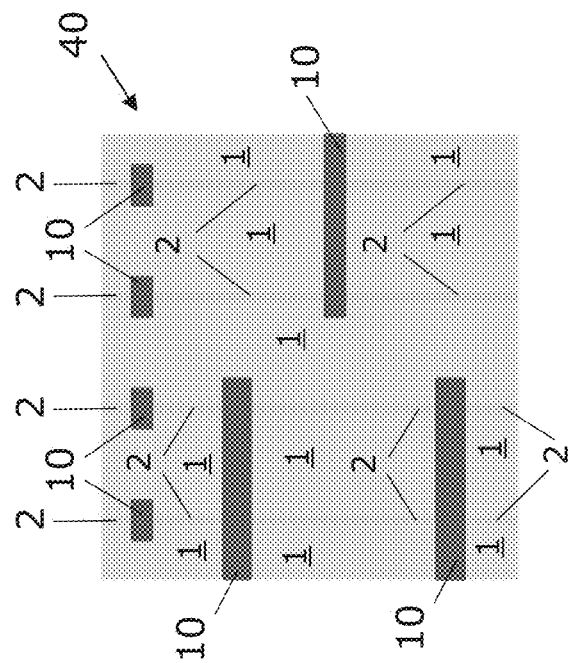
FIGS. 22A and 22B illustrate plan views on a semiconductor body during method steps of a method according to further embodiments.
Figure 22A:
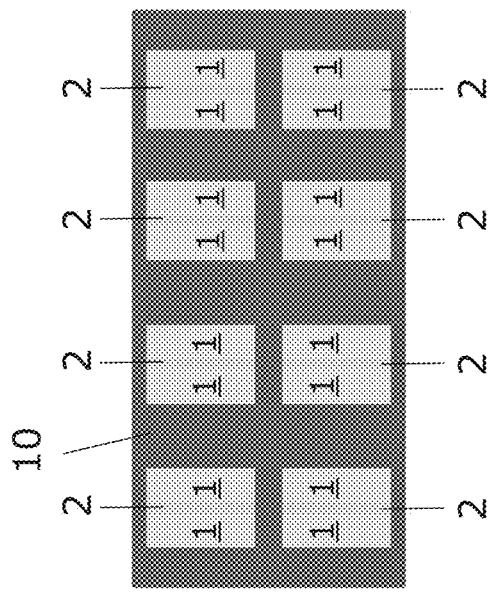

The layout of the support structure 10 may be as explained above with regard to FIGS. 10A and 10B. Further examples are illustrated in FIGS. 22A and 22B showing a contiguous support structure 10 and a support structure 10 of bar-shaped portions 10 bridging two or more sacrificial layers 2 (and trenches), respectively.

When viewed from above, the support structure 10 may also include substantially ring-shaped, circular, ellipsoidal, hexagonal or other polygonal structures.

Referring to FIGS. 23A and 23B, method steps of a method for forming a semiconductor device 400 are explained. The semiconductor device 400 to be manufactured is typically also a TEDEFT.

In a first step, a semiconductor substrate 40 having an upper surface (101) and a semiconductor layer 1 of a semiconductor material and extending to the upper surface (101) is provided.

Thereafter, wide trenches 52 may be etched from the upper surface (101) into the semiconductor layer 1 so that first semiconductor mesas 1 are formed which are separated from each other by the wide trenches 52 and connected by remaining semiconductor portions 10 of the first semiconductor layer 1, i.e. portions 10 of the semiconductor material, typically silicon. The resulting semiconductor structure 400 is illustrated in FIG. 23A showing a plan view on the upper surface (101) of the semiconductor body 40.

In so doing, spaced apart semiconductor mesas 1 and a support structure 10 therefore and extending to the upper surface are formed in a common etching process.

The wide trenches 52 may be formed as elongated rectangles with a larger horizontal extension (width) $w_1$ of several ten microns up to more than about 100 µm, when viewed from above. Furthermore, the wide trenches 52 typically form at least in an active device area of unit cells a regular two-dimensional array, when viewed from above. Even further, the wide trenches 52 are typically formed such that substantially parallel first semiconductor mesas 1 are formed having a larger, for example at least three times, at least five times or even at least ten times large maximum extension than the wide trenches 52 when viewed from above.

In a first vertical cross-section substantially perpendicular to the upper surface along the dashed line $s_1$, the semiconductor body 40 typically has a plurality of spaced apart wide trenches 52 extending from a common substrate to the upper surface.

In a second vertical cross-section substantially perpendicular to the upper surface along the dashed line $s_2$, the semiconductor body 40 may only include the common substrate and a contiguous remaining portion 1, 10 of the semiconductor layer 1 extending from the common substrate to the upper surface.

Thereafter, dielectric layers 3 may be formed at least at sidewalls of the first semiconductor mesas 1 and the semiconductor portions 10. Typically, this results in substantially ring-shaped dielectric structures 3 when viewed from above.

Typically, the dielectric layers 3 are formed by thermal oxidation.

Thereafter, a selective epitaxial growth process followed by an optional planarization process may be used to fill the wide trenches 52 with second semiconductor mesas 15. The resulting semiconductor structure is illustrated in FIG. 23B.

In embodiments in which a TEDEFT is to be manufactured, the first and second semiconductor mesas 1, 15 (or more typically portions thereof) typically form drift control zones 1, and drift zones 15, respectively.

Figure 24A:
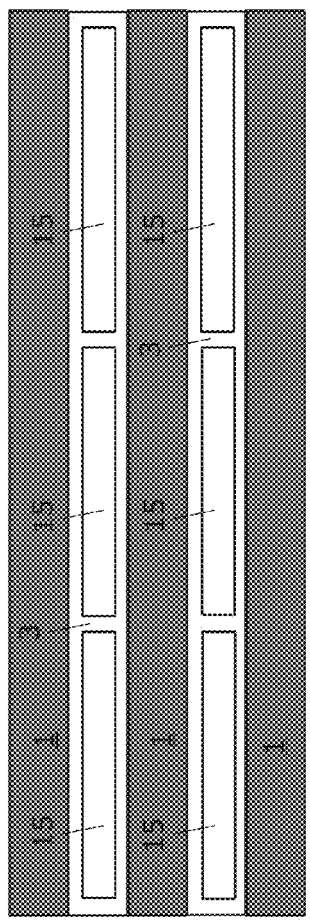
FIGS. 24A and 24B plan views on a semiconductor body during method steps of a method according to further embodiments

In embodiments in which the horizontal extension (width) $w_2$ of the semiconductor portions 10 between adjacent wide trenches 52 is small enough, the forming of dielectric layers 3 by thermal oxidizing may result in a complete oxidizing of the semiconductor portions 10 as illustrated in FIG. 24A for the structure 401. In so doing, edge regions of the second semiconductor mesas 15 which may have crystal defects may be removed.

Figure 24B:
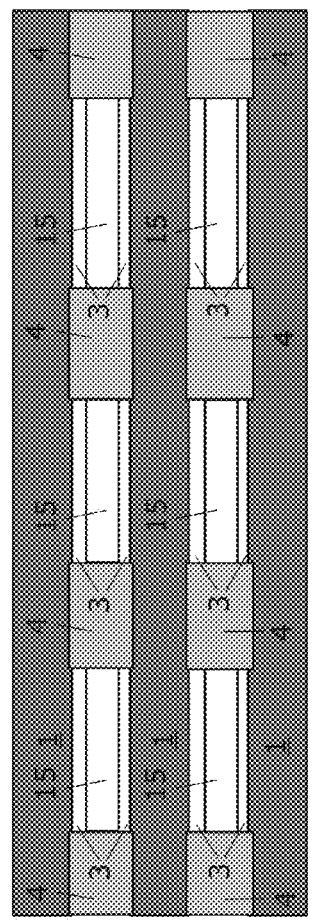

In other embodiments, the semiconductor portions 10 and adjoining parts of the dielectric layers 3 are replaced by dielectric plugs 4 as illustrated in FIG. 24B for the structure 402. This may be achieved by masked etching, depositing a dielectric material, a planarization process and/or partially back-etching the deposited dielectric material. In so doing, edge regions of the second semiconductor mesas 15 which may have crystal defects may be removed.

Referring to FIGS. 25A and 25B, method steps of a further method for forming a semiconductor device 403 are explained. The method is similar as explained above with regard to FIGS. 23A and 23B. However, the step of etching wide trenches 52 is performed such that the wide trenches 52 and the semiconductor portions 10 form a respective triangular lattice instead of respective rectangular lattices, when viewed from above.

Figure 26A:
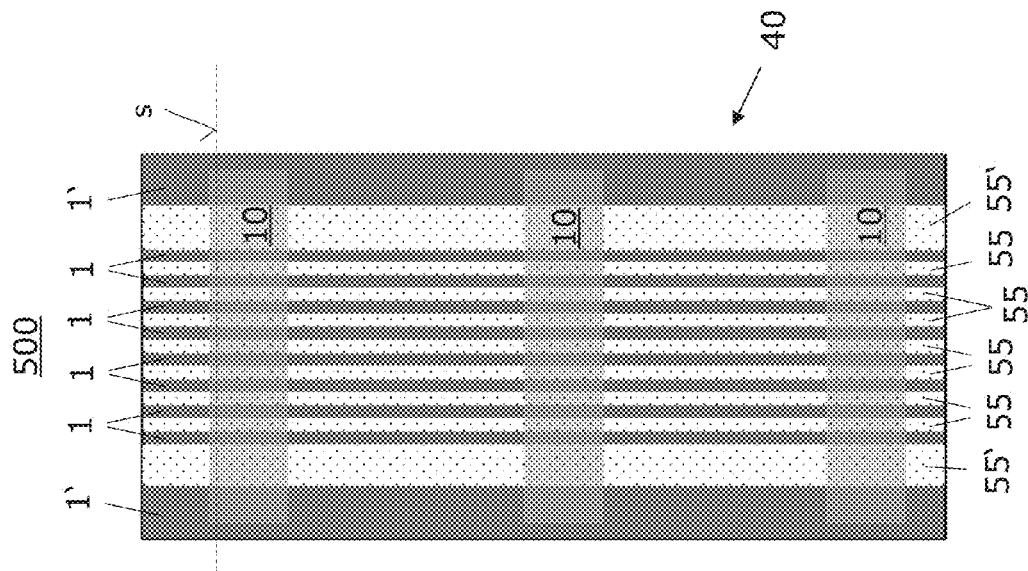
FIGS. 26A and 26B illustrate vertical cross-section through a semiconductor body and a plan view on a semiconductor body during method steps of a method according to further embodiments.
Figure 26B:
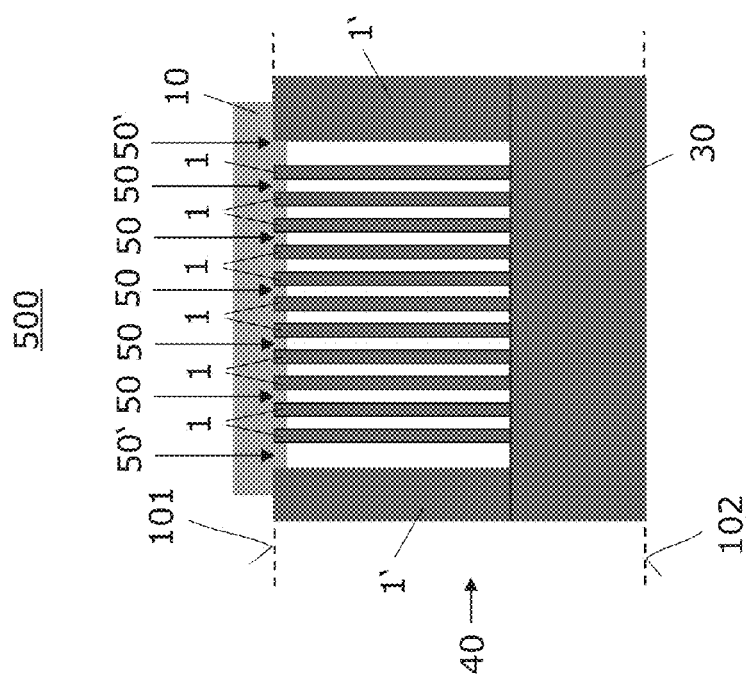

Referring to FIGS. 26A and 26B, method steps of a method for forming a semiconductor device 500 are explained.

In a first step, a semiconductor substrate 40 having an upper surface 101 and a semiconductor layer 1 extending to the upper surface 101 may be provided.

Thereafter, trenches 50, 50' may be etched from the upper surface 101 into the semiconductor layer 1. Accordingly, semiconductor mesas 1 having sidewalls are formed. The semiconductor mesas 1, 1' and sidewalls, respectively, are separated from each other by the trenches 50, 50' having respective bottom walls 55, 55'.

Thereafter, a support structure 10 mechanically connecting the semiconductor mesas 1, 1' may be formed at the upper surface 101. The resulting semiconductor structure 500 is illustrated in FIGS. 26A and 26B showing a vertical cross-section (along line s) through and a plan view on the structure 500, respectively.

Accordingly, a plurality of the semiconductor mesas 1, 1' is formed typically extending from a common semiconductor layer 30 to the upper surface 101. The outermost semiconductor mesas 1' and the outermost trenches 50' (of one device to be manufactured) may have in the vertical cross-section of FIG. 26A have larger horizontal extensions compared to the inner semiconductor mesas 1 and inner trenches 50, respectively.

Forming the support structure 10 at the upper surface 101 typically includes depositing a negative resist, masked radiating the negative resist, and applying a film developer (photo developer) to form a resist structure (support structure) 10 capable of stabilizing the usually thin semiconductor mesas 1 at least during a subsequent rinsing, drying and/or a lithography performed from above.

In embodiments in which a FinFET is to be manufactured, the trenches 50, 50' and semiconductor mesas 1, 1' may have a vertical extension of up to 5 µm or even more microns while the width (horizontal extension in the cross-section of FIG. 26a) of the semiconductor mesas 1, 1' and trenches 50, 50' may be below about 150 nm or 100 nm and below about 300 nm, respectively.

Typically, the negative resist is radiated with a radiation having a minimum wavelength larger, for example by a factor of two or three, than the distance between adjacent semiconductor mesas 1. Accordingly, the radiation does substantially not enter the trenches 50, 50'. Accordingly, a support structure 10 may be formed which is arranged at and above the upper surface 101, but almost not in the trenches 50, 50' as illustrated in FIGS. 26A and 26B.

Thereafter, a doping step is used to implant dopants from above into the bottom walls 55, 55' and/or the mesa sidewalls while the semiconductor mesas 1, 1' are mechanically connected via the support structure 10. If dopants are to be implanted into portions of the bottom walls 55, 55' which are shadowed by the support structure 10 in plan view, an angled implantation may be used.

Thereafter, the support structure 10 may be removed, for example in a thermal process or by dry etching.

Referring to FIGS. 27A and 27B, method steps of a further method for forming a semiconductor device 501 are explained. The method is similar as explained above with regard to FIGS. 26A and 27B. However, the design of the support structure 10 illustrated in FIG. 27A is chosen such that the film developer cannot reach the un-cured resist in the shown right portion 50b (right of the dashed vertical line) which may also lie behind the shown left portion 50a. Accordingly, the trenches 50 in the portion 50b remain filled with the resist.

Thereafter, a first doping process (implantation from above) may be performed.

Thereafter, the cured resist may be completely or partially removed by dry etching. The resulting structure 501 is illustrated in FIG. 27B.

Thereafter, a second doping process (implantation from above) may be performed to implant dopants into parts of the portion 50a shadowed during the first doping process while the portion 50b remains shadowed.

Thereafter, the uncured resist in portion 50b may be removed.

The methods for forming semiconductor devices explained above with regard to FIGS. 1 to 27B have in common that a plurality of semiconductor mesas (1) extending to an upper side (101) are formed in a semiconductor substrate (40) so that adjacent semiconductor mesas (1) are spaced apart from each other by a trench (50), typically an empty trench (50), a substantially empty trench (50), or a trench (50) completely or at least substantially filled with a sacrificial layer (2). During forming the plurality of semiconductor mesas (1) or thereafter, at least one support structure (10, 20) mechanically connecting the semiconductor mesas (1) is formed. Accordingly, the semiconductor mesas (1) are stabilized for further processing. Thereafter, the semiconductor substrate (40) is processed from the upper side (101) while the semiconductor mesas (1) remain mechanically connected via the support structure (10).

In so doing, the risk of breaking off the mesas (1) and/or irreversibly forming firm contacts between adjacent mesas (1) during the further processing from the upper side (101) is at least substantially reduced. This is of particular importance for manufacturing field-effect semiconductor devices such as trench-DRAMs (Dynamic Random Access Memory), TEDETs and FinFETs having semiconductor mesas (1) of high aspect ratios, for example of at least about 10, 20 or even more, and/or small distances, for example of less than about 150 nm or even less than about 100 nm, between adjacent semiconductor mesas.

After subsequent manufacturing steps in which the semiconductor mesas (1) are spaced apart from each other by trenches (50) that are empty, substantially empty, or at least partly fluid filled, but stabilized by the at least one support structure (10, 20), the at least one support structure (10, 20) may be partly or completely removed, for example after at least partly filling the trenches (50) again with a solid material such as a dielectric or poly-silicon to stabilize the semiconductor mesas (1).

According to an embodiment, a method for forming a semiconductor device includes: forming in a semiconductor substrate (40) a plurality of semiconductor mesas (1) extending to an upper side (101) so that adjacent semiconductor mesas (1) are spaced apart from each other by a trench (50), typically an empty trench (50), a substantially empty trench (50), or a trench (50) completely or at least substantially filled with a material (2) selectively etchable with respect to the semiconductor mesas (1), for example filled with a dielectric layer (2); forming a support structure (10) mechanically connecting the semiconductor mesas (1) which are spaced apart from each other by one of the substantially empty trench (50) and the trench (50) substantially filled with the material; and processing the semiconductor substrate (40) from the upper side (101) while the semiconductor mesas (1) are mechanically connected via the support structure (10).

According to an embodiment, a method for forming a semiconductor device includes: providing a semiconductor substrate (40) having an upper side (101) and comprising a plurality of semiconductor mesas (1) which are, in a vertical cross-section substantially orthogonal to the upper side, spaced apart from each other and extend to the upper side (101), at the upper side (101) a support structure (10) mechanically connecting the semiconductor mesas (1); and processing the semiconductor substrate (40) from the upper side (101) while the semiconductor mesas (1) remain mechanically connected via the support structure (10).

Typically, the semiconductor mesas (1) are spaced apart from each other by trenches (50) which are at least substantially empty or at least substantially filled with a material selectively etchable with respect to a monocrystalline semiconductor material of the semiconductor mesas (1).

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, the method comprising:
   providing a semiconductor substrate having an upper side and comprising, in a vertical cross-section substantially orthogonal to the upper side, a plurality of semiconductor mesas of a first monocrystalline semiconductor material which are spaced apart from each other by sacrificial layers selectively etchable with respect to the first monocrystalline semiconductor material and arranged in trenches extending from the upper side into the semiconductor substrate;
   forming on the semiconductor mesas a support structure mechanically connecting the semiconductor mesas;
   at least partly replacing the sacrificial layers while the semiconductor mesas remain mechanically connected via the support structure; and
   at least partly removing the support structure.

2. The method of claim 1, wherein at least partly replacing the sacrificial layers comprises at least one of etching the sacrificial layers selective to the semiconductor mesas to expose sidewalls of the semiconductor mesas, and thermal oxidizing the sidewalls; and/or wherein the support structure is formed substantially above the semiconductor mesas.

3. The method of claim 1, wherein the sacrificial layers comprise a dielectric material, carbon, diamond-like carbon, a photo resist, a polycrystalline semiconductor material, an amorphous semiconductor material and/or a second monocrystalline semiconductor material different to the first monocrystalline semiconductor material.

4. A method for forming a semiconductor device, the method comprising:
   providing a semiconductor substrate comprising an upper side and a semiconductor layer comprised of a semiconductor material and extending to the upper side;
   etching wide trenches from the upper side into the semiconductor layer so that first semiconductor mesas are formed which are separated from each other by the wide trenches and connected by semiconductor portions comprised of the semiconductor material;
   forming dielectric layers at least at sidewalls of the first semiconductor mesas; and
   performing a selective epitaxial growth process to fill at least one of the wide trenches with a second semiconductor mesa.

5. The method of claim 4, wherein forming the dielectric layers comprises oxidizing the sidewalls of the first semiconductor mesas and/or at least partially oxidizing the semiconductor portions.

6. The method of claim 4, wherein the dielectric layers are formed such that they are substantially ring-shaped when viewed from above.

* * * * *